United States Patent
Saarela et al.

(10) Patent No.: US 12,323,131 B2
(45) Date of Patent: Jun. 3, 2025

(54) SPRING-MASS MICROELECTROMECHANICAL RESONATOR

(71) Applicant: KYOCERA TECHNOLOGIES OY, Espoo (FI)

(72) Inventors: Ville Saarela, Espoo (FI); Antti Jaakkola, Espoo (FI); Aarne Oja, Espoo (FI)

(73) Assignee: KYOCERA TECHNOLOGIES OY, Espoo (FI)

( * ) Notice: Subject to any disclaimer, the term of this patent is extended or adjusted under 35 U.S.C. 154(b) by 909 days.

(21) Appl. No.: 17/602,351

(22) PCT Filed: Apr. 15, 2020

(86) PCT No.: PCT/FI2020/050249
§ 371 (c)(1),
(2) Date: Oct. 8, 2021

(87) PCT Pub. No.: WO2020/212648
PCT Pub. Date: Oct. 22, 2020

(65) Prior Publication Data
US 2022/0166406 A1  May 26, 2022

(30) Foreign Application Priority Data
Apr. 15, 2019 (FI) ........................................ 20195305

(51) Int. Cl.
*H03H 9/24* (2006.01)
*B81B 3/00* (2006.01)
(Continued)

(52) U.S. Cl.
CPC ......... *H03H 9/2473* (2013.01); *B81B 3/0078* (2013.01); *B81B 7/02* (2013.01); *H03H 3/013* (2013.01); *H03H 9/02448* (2013.01)

(58) Field of Classification Search
CPC ............. H03H 9/2473; H03H 9/02448; H03H 9/2484; H03H 9/2405; H03H 9/02244;
(Continued)

(56) References Cited

U.S. PATENT DOCUMENTS 7,420,318 B1  9/2008  Pulskamp
9,246,414 B2 *  1/2016  Sakaguchi ............. H02N 2/188
(Continued)

FOREIGN PATENT DOCUMENTS

EP  1271775 A1  1/2003
EP  3106833 A2  12/2016
(Continued)

OTHER PUBLICATIONS

European Patent Office, Partial Supplementary European Search, Application No. 20790942.5, mailed Dec. 20, 2022, 15 pages.
(Continued)

*Primary Examiner* — Emily P Pham
(74) *Attorney, Agent, or Firm* — Ziegler IP Law Group LLC

(57) ABSTRACT

A microelectromechanical (MEMS) resonator includes a spring-mass system having a first weight portion (M1), a second weight portion (M2), and a central spring portion (SP) in between the weight portions. The weight portions are connected (or mechanically attached) to the central spring portion and thus improving stability.

32 Claims, 17 Drawing Sheets

(51) Int. Cl.
*B81B 7/02* (2006.01)
*H03H 3/013* (2006.01)
*H03H 9/02* (2006.01)

(58) Field of Classification Search
CPC .............. H03H 3/013; H03H 3/0076; H03H 2009/02307; H03H 2009/02322; H03H 2009/0233; B81B 3/0078; B81B 3/0067; B81B 7/02; B81B 7/00
See application file for complete search history.

(56) References Cited

U.S. PATENT DOCUMENTS

| | | | |
|---|---|---|---|
| 9,559,660 | B2 | 1/2017 | Pensala et al. |
| 9,923,545 | B2 * | 3/2018 | Clark ................. H02N 1/008 |
| 2002/0189353 | A1 | 12/2002 | Knowles et al. |
| 2005/0195049 | A1 * | 9/2005 | Huang .............. H03H 3/0077 333/186 |
| 2007/0001783 | A1 | 1/2007 | Lutz et al. |
| 2013/0239684 | A1 | 9/2013 | Yamamoto |
| 2013/0300521 | A1 * | 11/2013 | Khine .................. H03H 9/54 333/187 |
| 2014/0230549 | A1 | 8/2014 | McNeil et al. |
| 2016/0099703 | A1 | 4/2016 | Jaakkola et al. |
| 2016/0231116 | A1 | 8/2016 | Piirainen |
| 2018/0205363 | A1 | 7/2018 | Hirota et al. |
| 2018/0231090 | A1 | 8/2018 | Gnerlich et al. |
| 2019/0074812 | A1 | 3/2019 | Inoue et al. |
| 2019/0097600 | A1 | 3/2019 | Yoshii et al. |

FOREIGN PATENT DOCUMENTS

| | | | |
|---|---|---|---|
| EP | 3312559 | A1 | 4/2018 |
| EP | 3382400 | A1 | 10/2018 |
| JP | 2008545333 | A | 12/2008 |
| JP | 2016099269 | A | 5/2016 |
| JP | 2017537500 | A | 12/2017 |
| JP | 2018522461 | A | 8/2018 |
| WO | 2007005132 | A1 | 1/2007 |
| WO | 2012081457 | A | 6/2012 |
| WO | 2013005625 | A | 1/2013 |
| WO | 2014188317 | A1 | 11/2014 |
| WO | 2016064678 | A1 | 4/2016 |
| WO | 2016205770 | A1 | 12/2016 |
| WO | 2017203741 | A1 | 11/2017 |
| WO | 2017212677 | A1 | 12/2017 |
| WO | 2018008480 | A1 | 1/2018 |
| WO | 2019058632 | A1 | 3/2019 |

OTHER PUBLICATIONS

Japenese Patent Office, Notice of reasons for refusal, Patent Application No. 2021-559712, Drafting of Mailing Feb. 29, 2024, 7 Pages.

"Murata develops world's smallest 32.768 kHz MEMS resonator", Murata Manufacturing Co., LTS, Oct. 4, 2018, 2 pages.

Bannon et al, "High-Q HF microelectromechanical filter", IEEE Journal of Solid-State Circuits, vol. 35, No. 4, 512 (2000); pp. 512-526, DOI: 10.1109/4.839911, 15 pages.

Finnish Patent and Registration Office, Search Report, U.S. Appl. No. 20/195,305, Mailed Aug. 9, 2019, 2 pages.

International Search Report, Application No. PCT/FI2020/050249, Mailed Jun. 30, 2020, 5 pages.

Jaakkola et al, "Design Rules for Temperature Compensated Degenerately n-Type Doped Silicon MEMS Resonators", Journal of Microelectromechanical Systems, vol. 24, No. 6, DOI: 10.1109/JMEMS.2015.2443379, Dec. 6, 2015, 8 pages.

Jaakkola, Antti, "Piezoelectrically Transduced Temperature Compensated Silicon Resonators for Timing and Frequency Reference Applications." Doctoral Dissertations, Department of Applied Physics, 2016, 100 pages.

Kaajakari et al, "A 32.768 kHz MEMS Resonator with +/−20 ppm Tolerance in 0.9 mm×0.6 mm Chip Scale Package", 4 pages.

Wood et al, "An Investigation of Structural Dimension Variation in electrostatistally Coupled MEMS Resonator Pairs Using Mode Localization" IEEE Sensors Journal, vol. 16, No. 24, DOI: 10.1109/JSEN.2016.2573850, Dec. 15, 2016, 9 pages.

Wood et al, "Sensor based on the mode-localization effect in electrostatistically-coupled MEMS resonators fabricated using an SOI process" 2015 IEEE Sensors, pp. 1-4, DOI: 10.1109/ICSENS.2015.7370338, 4 pages.

Written Opinion of The International Searching Authority, Application No. PCT/FI2020/050249, Mailed Jun. 30, 2020, 6 pages.

Zhao et al, "A review on couples MEMS resonators for sensing applications utilizing mode localization", Sensors and Actuators, 2016 Elsevier B.V. DOI:, 10.1016/j.sna.2016.07.015, 19 pages.

Finnish Patent and Registration Office, Office Action, U.S. Appl. No. 20/195,305, Mailed Jan. 21, 2020, 5 pages.

* cited by examiner

SPRING-MASS MICROELECTROMECHANICAL RESONATOR

FIELD

The aspects of the disclosed embodiments generally relates to microelectromechanical (MEMS) resonators.

BACKGROUND

This section illustrates useful background information without admission of any technique described herein representative of the state of the art.

Low frequency clock references are conventionally obtained from quartz tuning fork resonators, such as 32.768 kHz quartz tuning fork resonators.

Microelectromechanical (MEMS) resonators are being developed to provide the same functionality as quartz tuning forks with benefits such as reduced cost, smaller chip size, increased robustness against shock and vibrations, and better stability over a wide temperature range.

A key performance parameter in MEMS resonators such as silicon MEMS resonators used for frequency reference applications is the equivalent series resistance (ESR). ESR is inversely proportional to the quality factor Q of the resonator, and thus the maximization of this parameter is often desirable.

SUMMARY

The aspects of the disclosed embodiments are directed to providing a microelectromechanical resonator with desired properties.

According to a first example aspect of the disclosed embodiments there is provided a microelectromechanical resonator, comprising:
a spring-mass system having
a first weight portion,
a second weight portion, and
a central spring portion in between the weight portions.

In certain embodiments, the resonator comprises a body of silicon doped to an average impurity concentration of at least $2*10^{19}$ cm$^{-3}$, and material portions of the central spring portion are oriented along an x-axis perpendicular to an y-axis in which direction the resonator is configured to vibrate, wherein the x-axis runs along a <100> silicon crystal direction or deviates less than 5 degrees from that direction.

In certain embodiments, the central spring portion comprises arms, separated by trenches, aligned with a <100> silicon crystal direction or deviating less than 5 degrees from that direction.

In certain embodiments, the first and second weight portion are symmetric weight portions.

In certain embodiments, the central spring portion is a symmetric portion.

In certain embodiments, the central spring portion comprises a meandering structure attached at its first end to the first weight portion and at its opposite end to the second weight portion.

In certain embodiments, the first weight portion and the second weight portion are connected to the central spring portion at their edges.

In certain embodiments, the first and second weight portion comprise front, rear, right and left edges. Of the edges the front edge is the edge that faces the central spring portion. In certain embodiments, the first weight portion is connected to the central spring portion at the corner connecting the front and left edge and at the corner connecting the front and right edge. Similarly, the second weight portion is connected to the central spring portion at the corner connecting the front and left edge and at the corner connecting the front and right edge. In certain embodiments, the first and second weight portion are connected to the central spring portion in the area that is in the middle of the front edge.

In certain embodiments, the resonator supports an accordion mode shape. In certain embodiments, the resonator operates in an in-plane flexural mode. However, in certain other embodiments, the resonator operates in an out-of-plane mode. Accordingly, in certain embodiments, the resonator supports either an in-plane flexural vibration mode of operation or an out-of-plane flexural vibration mode of operation.

In certain embodiments, the central spring portion comprises (or is formed of) symmetrically placed folded springs. In certain embodiments, the central spring porting comprises (or is formed of) unfolded springs attached in series with each other, or attached in parallel with each other.

In certain embodiments, the first weight portion and the second weight portion are configured to vibrate symmetrically.

In certain embodiments, the resonator comprises symmetrically positioned anchoring points.

In certain embodiments, the resonator comprises anchoring points in the middle of a first edge and in the middle of an opposite edge of the spring portion in a direction of the resonator in which the resonator vibrates. Said direction (y-direction, as defined later in the description) may be a length direction or a width direction of the resonator depending on the form of the weight portions. The mentioned edges may form side edges of the resonator.

In certain embodiments, the number of anchoring points within the spring portion is two. In certain embodiments, the anchoring points are to anchor the resonator to surroundings (or to a surrounding substrate). In certain embodiments, the central spring portion comprises a connecting beam leading to an anchoring point. In certain embodiments, the connecting beam is aligned with the center of mass of the central spring portion or of the spring-mass system. In certain embodiments, the connecting beam extends from a meandering shape of the central spring portion to an anchoring point.

In certain embodiments, the resonator comprises anchoring points aligned with a center of mass of the central spring portion or of the spring-mass system.

In certain embodiments, the resonator comprises an anchoring point to anchor the central spring portion to surroundings, a main resonance mode shape of the resonator having a nodal point at the anchoring point.

In certain embodiments, the resonator comprises semiconducting material. In certain embodiments, the resonator comprises silicon. In certain embodiments, the resonator comprises degenerately doped silicon. In certain embodiments, more than 50% of the resonator mass consists of degenerately doped silicon. In certain embodiments, the resonator comprises a body of silicon doped to an average impurity concentration of at least $2*10^{19}$ cm$^{-3}$, such as at least $10^{20}$ cm$^{-3}$. In certain embodiments, the resonator is a (single crystalline) silicon MEMS resonator.

In certain embodiments, the resonator is configured to be actuated piezoelectrically.

In certain embodiments, the longitudinal axis of individual spring elements of the central spring portion is oriented along [100] crystal direction of silicon. Accordingly, in certain embodiments (elongated) material portions of the central spring portion are oriented along an x-axis perpendicular to an y-axis in which direction the resonator is configured to vibrate, wherein the x-axis runs along a <100> silicon crystal direction or deviates less than 5 degrees from that direction. In certain embodiments, the material portions herein comprise straight portions or individual spring elements separated (in y-direction) from each other by trenches.

In certain embodiments, the longitudinal axis of the resonator is defined to be the direction in which the resonator vibrates.

In certain embodiments, the resonator operates in vacuum.

In certain embodiments, a trench at the end (or rear edge) of the weight portions has a width reducing air damping effect. The width depends on the embodiment in question. In certain embodiments, the width of larger than 5 μm is applied.

In certain embodiments, the rear edge of the weight portions is an outer end of the resonator.

In certain embodiments, the resonator comprises the first and second weight portion comprise a grid of trenches.

In certain embodiments, the resonator is fabricated on a silicon-on-insulator, SOI, wafer (or a SOI type of wafer). In certain embodiments, the resonator is fabricated on a Cavity SOI (C-SOI) wafer.

In certain embodiments, the resonator is configured to operate at 32 kHz frequency band, such as at the frequency 32.768 kHz.

In certain embodiments, the central spring portion is oriented along a diagonal of a rectangular die.

In certain embodiments, the spring-mass system comprises additional support springs attached to the first and second weight portions.

In certain embodiments, the support springs are additional to the spring(s) of the central spring portion. Accordingly, the support springs are separate from the central spring portion. In certain embodiments, the support springs are attached to the rear edge of the first and second weight portion (i.e., the edge opposite to the edge facing the central spring portion).

In certain embodiments, a first part of the resonator resides in a degeneratively doped silicon layer and a second part of the resonator resides in a $SiO_2$ layer formed beneath or above or on both sides of the degeneratively doped silicon layer.

In certain embodiments, the silicon oxide $SiO_2$ layer is positioned next to the degeneratively doped silicon layer or in the middle of the degeneratively doped silicon layer so that the $SiO_2$ layer divides the degeneratively doped silicon layer into two parts.

In certain embodiments, the resonator oscillates in the direction of the y-axis. The first and second weight portions connected by the central spring portion undergo periodic movement in which the weight portions either come closer to each other or go farther from each other. In certain embodiments, the movement is a back-and-forth movement. In certain embodiments, the coordinate system is selected so that y-axis is in the longitudinal direction of the resonator and the x-axis is perpendicular to the y-axis, but depending on the embodiment the resonator may be longer in the x-direction (or equally long) than in the y-direction. The first weight portion is spaced apart from the second weight portion in the y-direction. In certain embodiments, the y-direction is defined as a direction that passes (goes) through the center of mass of the first weight portion and through the center of mass of the second weight portion. In certain embodiments, the y-direction is defined as the direction in which the central spring portion is allowed to vibrate (in the plane of the resonator). In certain embodiments, the resonator oscillates only in a single plane. In certain embodiments, the resonator oscillates only in one dimension (+y and −y direction). In certain other embodiments, the resonator oscillates in an out-of-plane mode (+z and −z directions).

In certain embodiments, the smaller dimension (width in y-direction) of the folded springs on unfolded springs mentioned in the preceding is equal. In certain embodiments, the folded springs or unfolded springs form a repeating structure within the central spring portion.

In certain embodiments, the resonator structure has reflection symmetry. In certain embodiments, the resonator structure has mirror symmetry. In certain embodiments, the mirror symmetry is with respect to x-axis and/or y-axis. In certain embodiments, the intersection of the x-axis and y-axis is in the center of mass of the resonator structure. In certain embodiments, the resonator structure has rotational symmetry.

In certain embodiments, the resonator comprises the first and second weight portions and the central spring portion arranged in the shape of a tuning fork with side masses.

In certain embodiments, the resonator comprises a set of double-ended tuning fork resonators positioned in a row and connected with shared mass elements or connection beams.

In certain embodiments, the resonator comprises:
a materials stack with a silicon oxide layer in between a top electrode layer and a bottom electrode layer.

In certain embodiments, the resonator further comprises third and fourth weight portions, wherein the central spring portion is arranged in the form a cross with a mechanical anchor at its center.

In certain embodiments, the resonator comprises two top electrodes with opposite polarities and an electrically floating bottom electrode (or device layer).

In certain embodiments, an "accordion" type of a silicon MEMS resonator is disclosed. Symmetric first and second weight portions vibrate (or oscillate) as controlled (or dictated) by the spring constant of the central spring portion (or the spring-mass system). In certain embodiments, the transduction of the resonator is based on using a piezoelectric thin film.

In certain embodiments, resonator structures with low acoustic losses, i.e., high quality factor, and low ESR is disclosed. Good frequency stability over a wide temperature range may be obtained when the resonator is fabricated on heavily phosphorus-doped silicon with correct alignment with respect to the Si crystalline structure.

Different non-binding example aspects and embodiments have been presented in the foregoing. The above embodiments and embodiments described later in this description are used to explain selected aspects or steps that may be utilized in implementations of the present disclosed embodiments. It should be appreciated that corresponding embodiments apply to other example aspects as well. Any appropriate combinations of the embodiments can be formed.

BRIEF DESCRIPTION OF THE DRAWINGS

The disclosed embodiments will now be described, by way of example only, with reference to the accompanying drawings, in which.

DETAILED DESCRIPTION

In the following description, like numbers denote like elements.

Figure 1A:
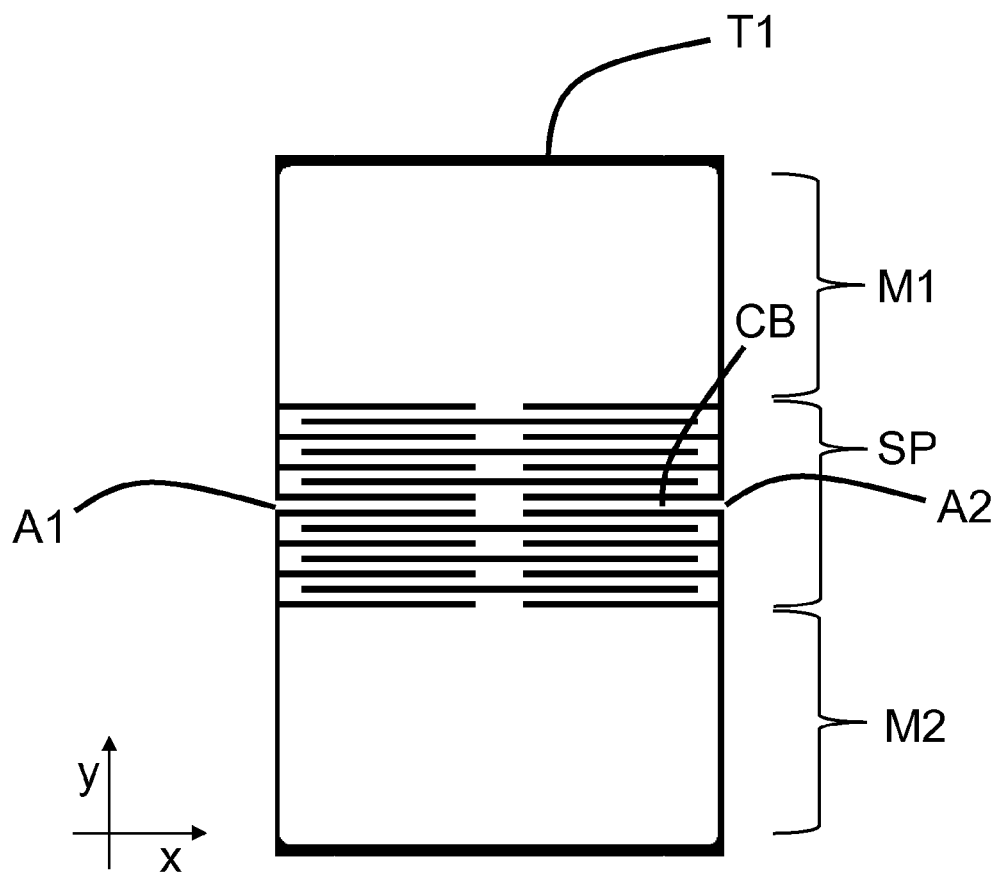
FIG. 1A shows a microelectromechanical (MEMS) resonator in accordance with certain embodiments.

FIG. 1A shows a microelectromechanical (MEMS, microelectromechanical systems) resonator in accordance with certain embodiments. In more detail, FIG. 1A shows a top view of the resonator structure. The coordinate system is selected so that y-axis is in the longitudinal direction of the resonator and the x-axis is perpendicular to the y-axis. The resonator oscillates in the direction of the y-axis.

The black portions in FIG. 1A (and in other drawings) represent trenches, i.e., the portion of a layer (typically silicon layer of a SOI wafer) that has been removed in a manufacturing process, typically etched away. The white portion within presented structure represents material portions, typically silicon or degeneratively doped silicon areas. A resonator geometry is thus defined. An electrode geometry for piezoelectric actuation has not been drawn in FIG. 1A.

Reference signs A1 and A2 denote points of anchoring to a surrounding substrate. The MEMS resonator is described as a spring-mass system with symmetric weight portions M1 and M2, wherein the mass M1=M2=M. The weight portions are connected by a central spring portion SP.

The central spring portion SP comprises springs that are folded (or equivalently, several unfolded springs that are attached in series or in parallel with each other). The compound spring constant can be made low to support a resonance mode with a low frequency in a small footprint.

The frequency f of the resonator is $f=1/(2\pi)\times\sqrt{K/M}$.

In the formula, the spring constant of the central spring portion is denoted by K.

The mode shape of the resonator is an "accordion mode", i.e., the weight portions M1 and M2 vibrate symmetrically in the +y and −y directions.

As to the alignment of the resonator, x-axis and y-axis preferably run along the <100> silicon crystal directions (or deviate less than 5 degrees from those directions). In certain embodiments, the length direction of the folded springs, i.e., the x-direction is oriented along the [100] crystal direction (or deviates less than 5 degrees from that direction).

The structure disclosed in FIG. 1A has mirror symmetry over both x- and y-axis going through the center of mass of the structure. By having symmetry, a good nodal point of the (main) resonance mode shape is obtained, appearing at the anchoring locations A1 and A2 that reside in the middle of side edges of the structure, thus leading to a high quality factor (under vacuum).

The reference sign T1 denoted the trench on the sides of masses M1 and M2 not parallel to the y-direction (direction of the vibration in the main resonance mode). In certain embodiments, trench T1 is larger than 5 µm to reduce air damping effects so as to decrease the dependence of the quality factor on the pressure, and to provide sufficient quality factor under atmospheric pressure so that the devices can be measured even under atmospheric pressure (although typical final operation condition for the resonator is under vacuum, achieved with vacuum encapsulation).

In modifications of the embodiments shown in FIG. 1A, the individual spring dimensions can be adjusted. Furthermore, the mass (weight portion) dimensions can vary. Furthermore, the number of springs within the central spring portion can vary. The preceding applies to all embodiments.

The first weight portion M1 (the second weight portion M2 similarly) has a front edge facing the central spring portion K, a right edge on its right side, a left edge on its left side, and a rear edge at the end of the resonator structure.

Figure 1B:
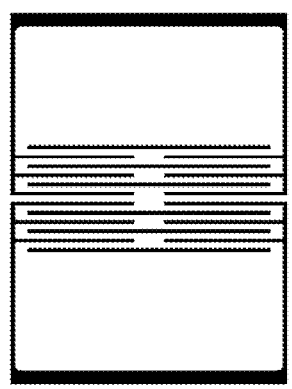
FIG. 1B shows a modified MEMS resonator in accordance with certain embodiments.

While the weight portions M1 and M2 are connected (or mechanically attached) to the central spring portion SP through a center area of the front edge(s) in the embodiment shown in FIG. 1A, an alternative embodiment shown in FIG. 1B discloses mechanical attachment to the central spring portion at the corners (connecting the front edge(s) and right and left edges) of the front edge only. The attachment shown in FIG. 1b shows two points of attaching both weight portions to the central spring portion thus improving stability.

In FIGS. 1A and 1B, connection beams CB extend in x-direction from the center of mass of the structure to the anchoring locations A1 and A2. Accordingly, the central spring portion is attached to the surrounding substrate by two points and to each of the weight portions by one or two points.

Figure 2:
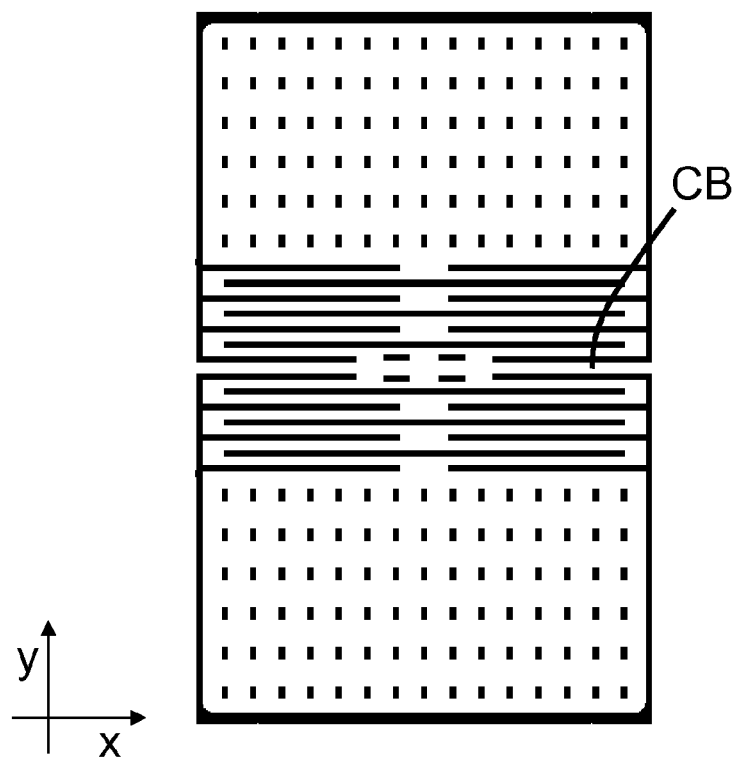
FIG. 2 shows a further MEMS resonator in accordance with certain embodiments.

FIG. 2 shows similar design as in FIG. 1A, but with mass (weight) portions including a grid of small trenches, which enable release of a buried oxide layer when the device is fabricated on a SOI (silicon-on-insulator) wafer. Furthermore, FIG. 2 shows slightly different central section to provide shorter connecting beam CB length for stronger anchoring of the resonator to the surrounding substrate. The central section of the central spring portion comprises an expanded material area to make the structure stronger. The expanded area is without the (meandering) springs. It may contain a plurality of trenches. The trenches may be symmetrically placed.

Figure 3:
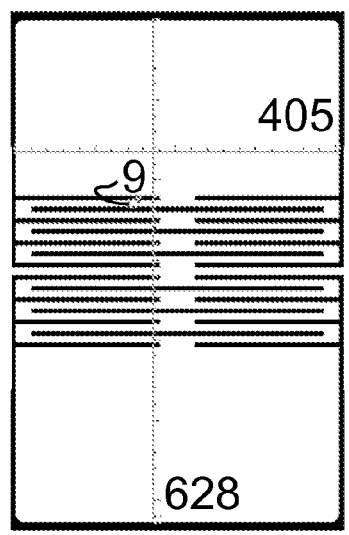
FIG. 3 shows certain dimensions of the MEMS resonator of FIG. 1A.

FIG. 3 shows dimensions of resonator of FIG. 1A displayed. These are example dimensions that can be used, e.g., to create a resonator operating at approximately a frequency of 32 kHz. The width of the resonator is 405 µm, the length of the resonator is 628 µm, and the smaller dimension (width) of an individual spring element is 9 µm. The thickness of the layer in which the resonator resides, i.e., the device layer can be, e.g., in the range of 4 to 20 µm.

Figure 4:
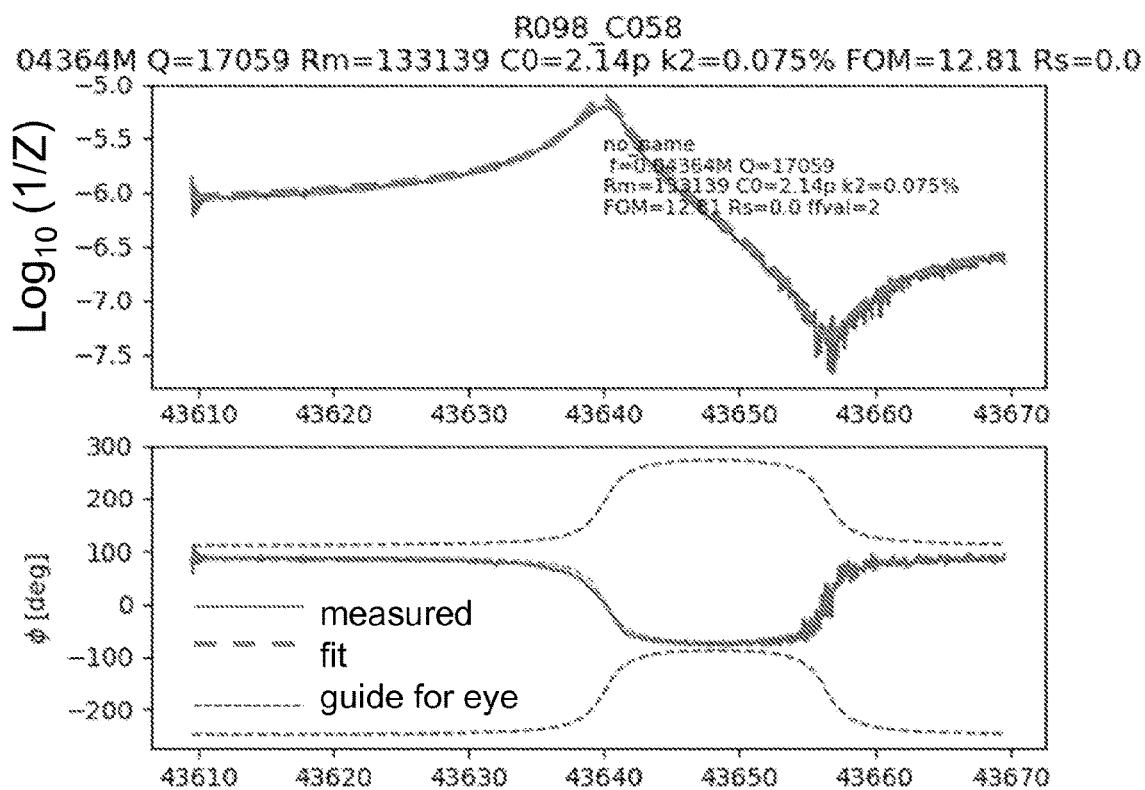
FIG. 4 shows experimental results relating to the MEMS resonator of the type shown in FIG. 1A.

FIG. 4 shows an experimental result, which is response of a test design operating at 44 kHz measured under a vacuum of p<0.1 mbar. Obtained quality factor was 17 000, and ESR was 133 kOhm.

Figure 5:
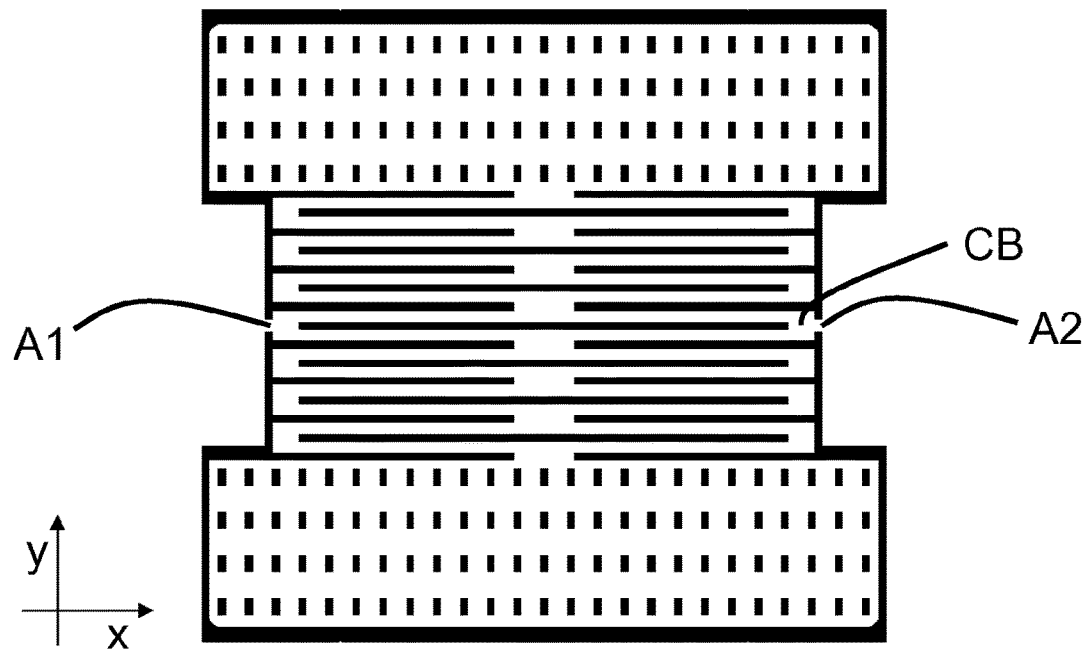
FIG. 5 shows a further MEMS resonator in accordance with certain embodiments.

FIG. 5 shows a similar resonator as in FIG. 2 but with different mass M1 and M2 dimensions, and with differently folded central spring structure, which enables the connecting beam element CB to be shorter so as to provide a stronger support of the resonator to the substrate. The connecting beam CB extends from an outer turning point of a meandering spring element to the anchoring point A2 (A1).

Figure 6:
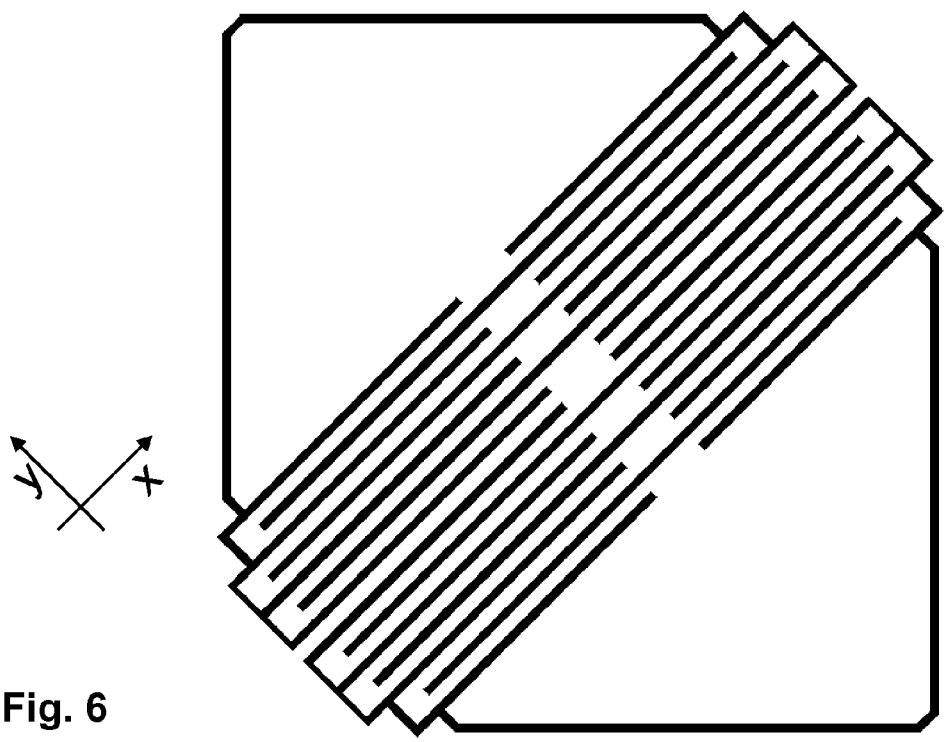
FIG. 6 shows a MEMS resonator with a diagonal design in accordance with certain embodiments.

FIG. 6 shows a spring along diagonal resonator structure. The effective length of the central folded spring structure is maximized within a given rectangular die area by orienting the spring along the diagonal of the die. Thus, the area needed for realizing, e.g., a 32 kHz resonance frequency resonator can be minimized.

Figure 7:
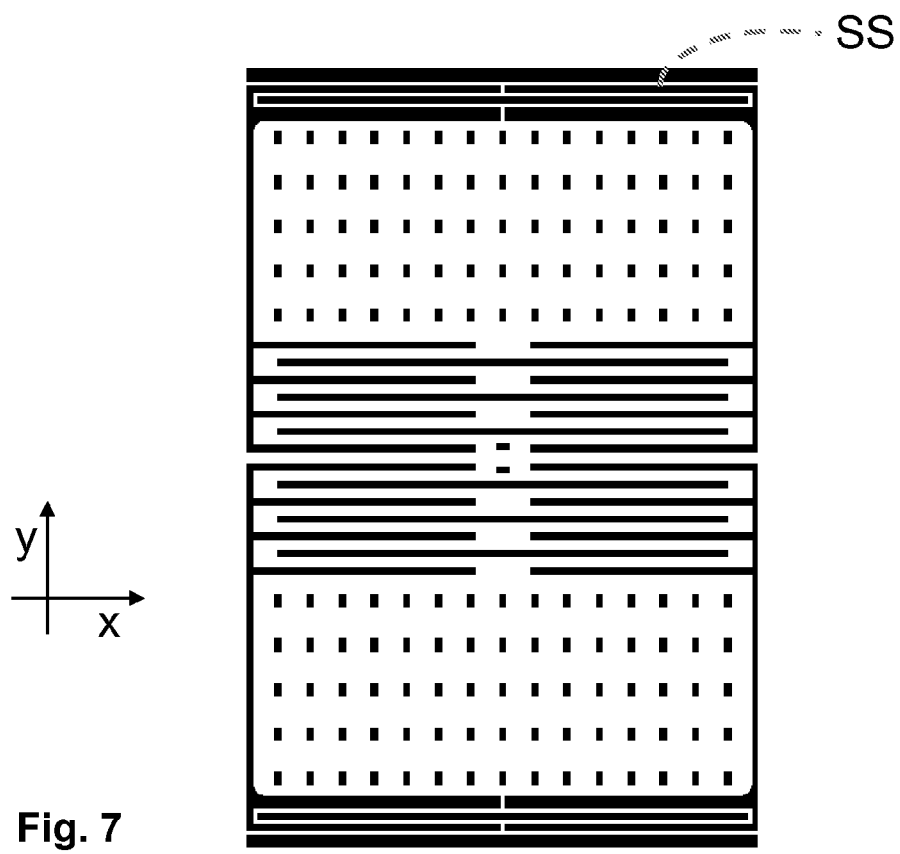
FIG. 7 shows a MEMS resonator with additional support springs in accordance with certain embodiments.

FIG. 7 shows a MEMS resonator having generally the structure of the resonator shown in FIG. 2, but with additional support springs SS attached to the mass portions M1 and M2 (the additional spring portions are also attached to the surrounding substrate, for example, at sides).

The spring constant of a support spring with respect to motion along the y-axis is less than $1/10$ of the main spring constant K of the resonator. There may be multiple support springs SS attached to masses M1 and M2. The support springs SS may attach to any (x- or y-directed) side of the masses M1 and M2.

The purpose of the support springs SS is to suppress parasitic resonance modes and to add stiffness to the structure with respect to z-directed (perpendicular to both x- and y-direction) displacement. This may benefit the manufacturability of the component as well as reliability during the operation of the device (one source of unreliability may be stiction of the structure to an underlying (silicon) handle wafer over a gap.

Figure 8:
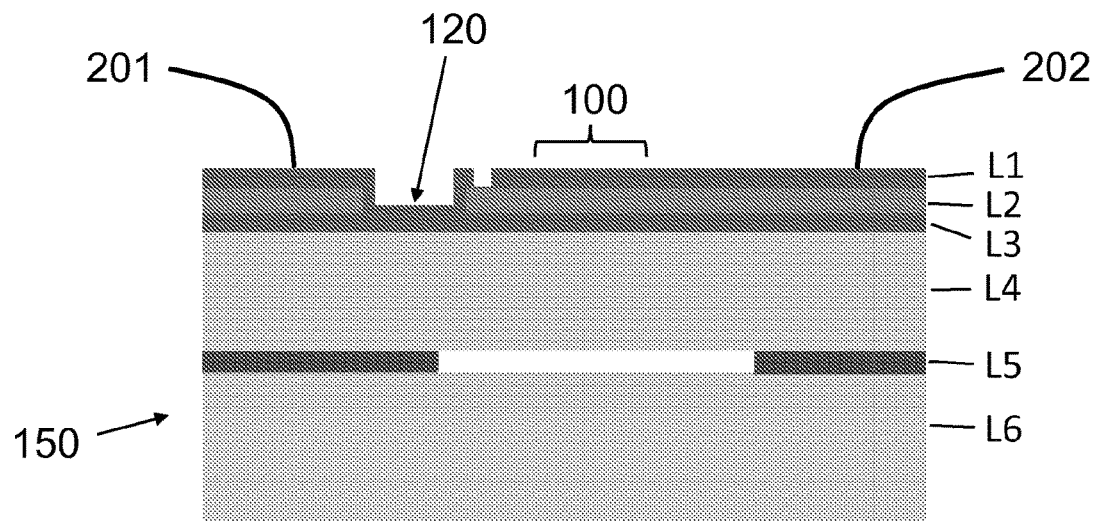
FIG. 8 shows a sectional view of a piezoelectrically actuated MEMS resonator in accordance with certain embodiments.

FIG. 8 shows an example cross section of a resonator device when fabricated on a SOI wafer 150. Layers L1-L6 are shown in the drawing with following explanations:

L2=piezoelectric layer: Transduction is based on the piezoelectric layer. Example layer materials are AlN, ScAlN, and ZnO. L2 thickness can be 1 µm, for example.

L1=top electrode layer: On the top side of the piezoelectric layer is a top electrode layer. The material of this layer may be Al, Mo, Au, polysilicon or any other suitable material that is electrically conductive. L1 thickness can be 1 µm, for example.

L3=bottom electrode layer: On the bottom side of the piezoelectric layer is a bottom electrode layer. The material of this layer may be Al, Mo, Au, polysilicon or any other suitable material that is electrically conductive. L3 thickness can be 1 µm, for example.

L4=doped silicon layer (resonator body and bottom electrode): Phosphorus doped single crystal silicon forms >50% of the mass of the resonator (or of the central spring portion).

In certain embodiments, the phosphorus doping concentration is more than $1*10^{19}$ cm$^{-3}$. It is possible that the doped silicon layer acts as the bottom electrode layer, i.e., layers L3 and L4 may be combined into a single silicon layer. L4 thickness can be in the range of 2 µm–20 µm, for example.

L5=buried oxide layer: This layer is etched from underneath the resonator structure in order to release the resonator (the resonator area marked by reference sign 100) to vibrate in its resonance mode.

L6=silicon handle layer.

In further embodiments, additional material layers may exist.

The reference numeral 201 indicates the electrical connection to the bottom electrode layer and reference numeral 202 indicates the electrical connection to the top electrode layer. An opening in layer L2 is denoted by reference numeral 120.

Figure 9:
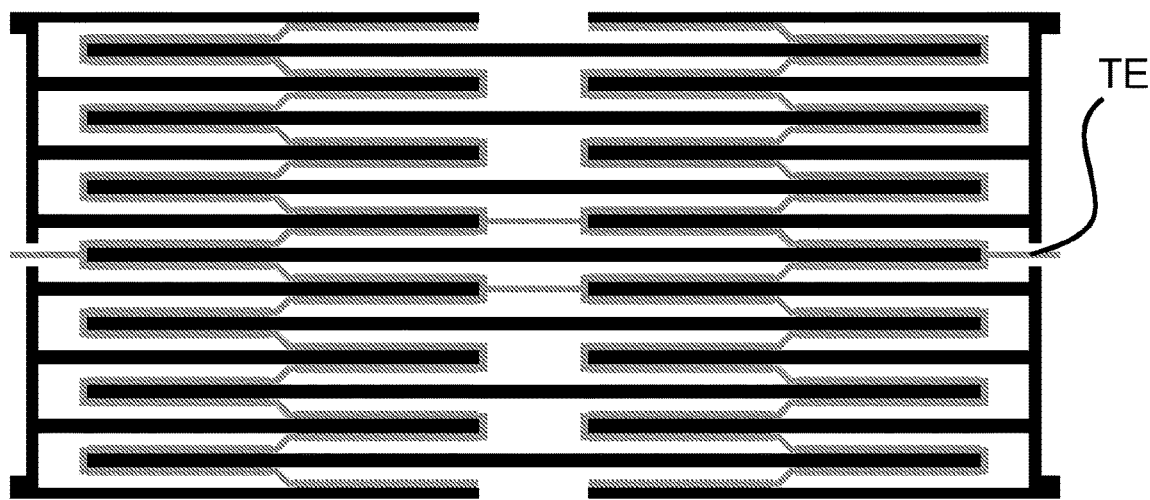
FIG. 9 shows an example of an electrode pattern for the resonator of FIG. 8.

FIG. 9 shows an example of the top electrode pattern (with reference to FIG. 8) which may be used in order achieve electromechanical transduction of the "accordion" resonance mode. TE denotes the top electrode in the drawing.

Figure 10:
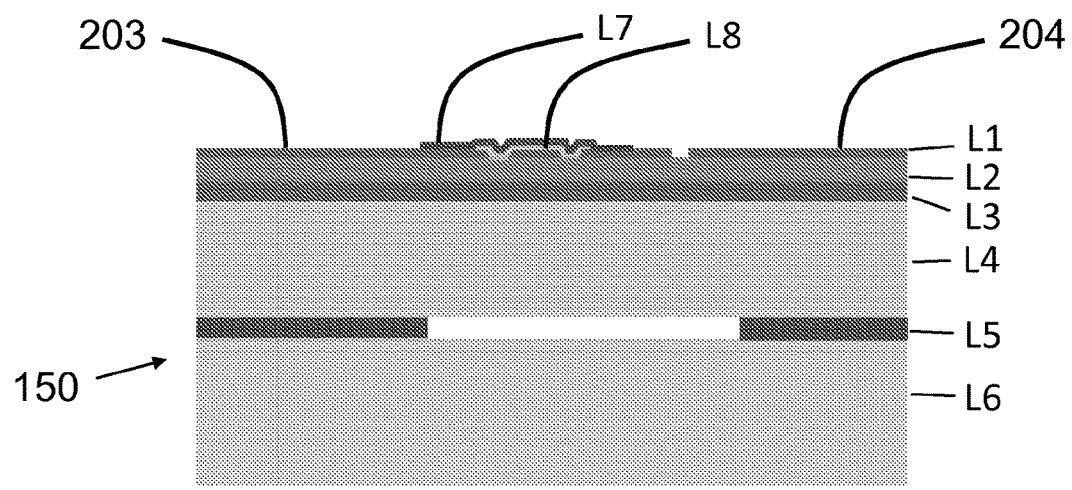
FIG. 10 shows an alternative sectional view of a MEMS resonator in accordance with certain embodiments.

FIG. 10 shows an alternative cross section of the resonator device, where the difference to FIG. 8 is that there are two polarities of the top electrode: 203 [$X_{in}$] and 204 [$X_{out}$], and the bottom electrode is floating. Since top electrode geometry of two polarities requires a crossing electrode pattern without electrical connection (see FIG. 11), additional material layers are needed: L7=bridge conductor layer, L8=bridge dielectric layer.

Figure 11:
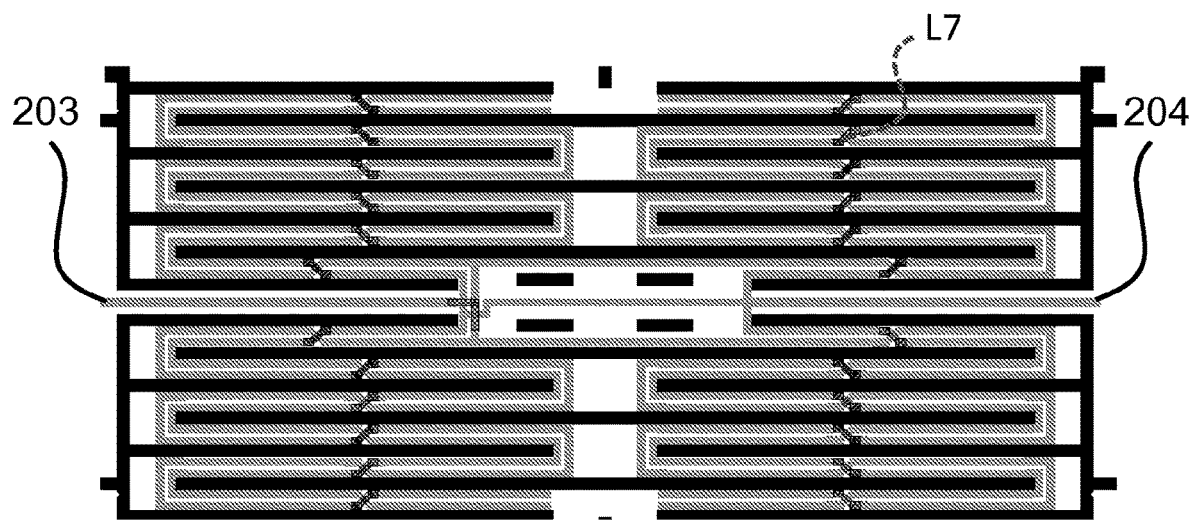
FIG. 11 shows an example of an electrode pattern for the resonator of FIG. 10.

FIG. 11 shows an example of the top electrode pattern (with reference to FIG. 10) which may be used in order achieve electromechanical transduction of the "accordion" resonance mode when the top electrode layer has regions of two polarities ($X_{in}$, $X_{out}$). Crossing of the traces of different polarities is achieved with using L7 bridge conductor layer and L8 bridge dielectric layer (L8 not shown in FIG. 11).

Figure 12A:
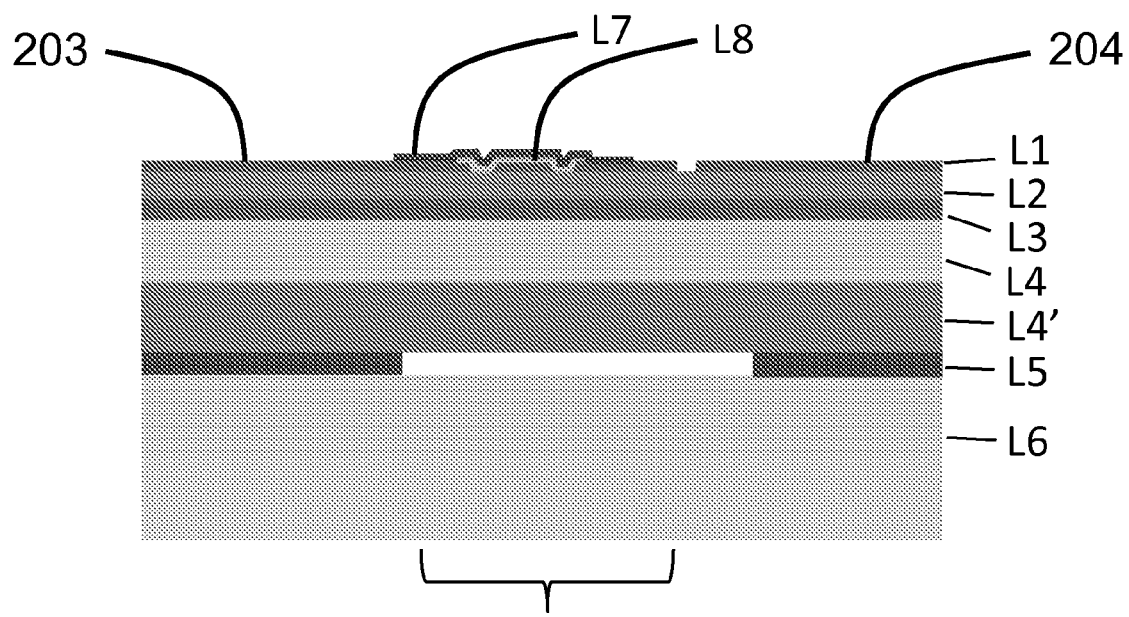
FIGS. 12A-C show sectional views of MEMS resonators in accordance with yet other embodiments.

FIG. 12A shows a sectional view of a MEMS resonator in accordance with yet other embodiments. In these embodiments, a thermal oxide layer L4' is provided. The thermal oxide layer, for example, a silicon oxide $SiO_2$ layer is positioned next (beneath or above) to the (degeneratively) doped silicon layer L4 or on both sides of the layer L4. In yet further embodiments the silicon oxide $SiO_2$ layer is positioned in the middle of the layer L4 so that the $SiO_2$ layer divides the L4 layer into two parts. The thermal oxide layer L4' is to improve thermal properties of the resonator. In certain embodiments, the linear temperature coefficient (of frequency) TCF1 of the resonator is modified (e.g., increased) by adding the thermal oxide layer. For example, it may be that a resonator without the thermal oxide layer has a slightly negative TCF1 (for example −5 ppm/° C.). By adding a thermal oxide layer with an appropriate thickness, which depends on the embodiment, the TCF1 is increased. The desired TCF1=0 can be achieved.

Figure 12B:
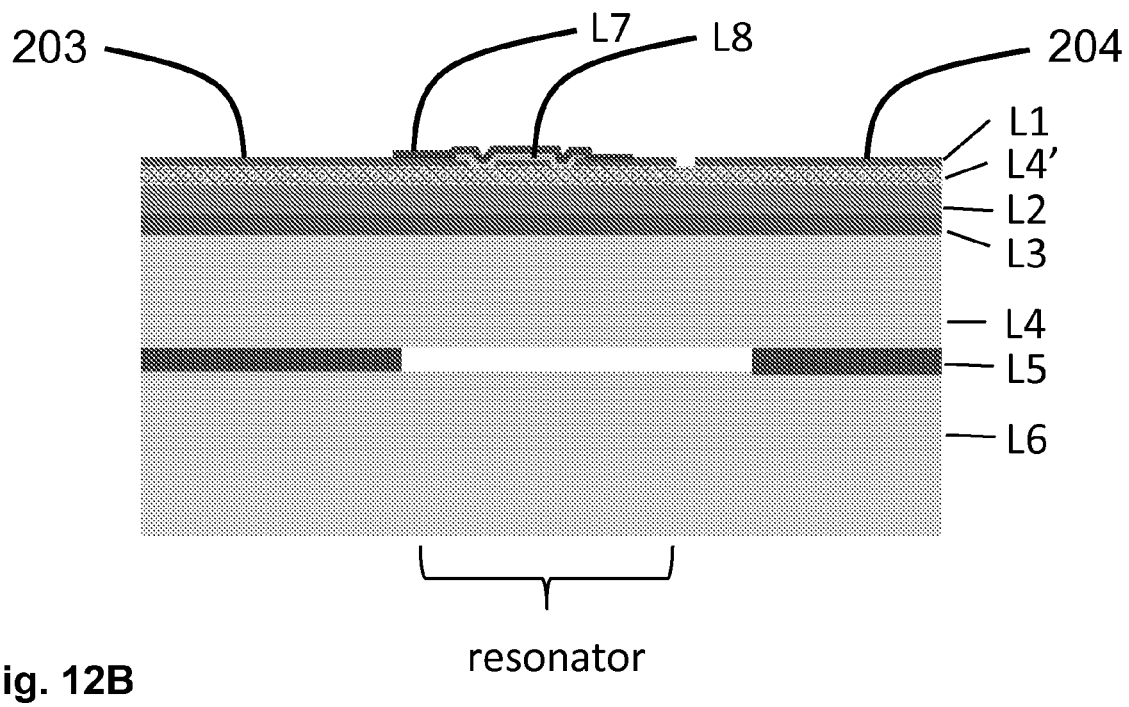
Figure 12C:
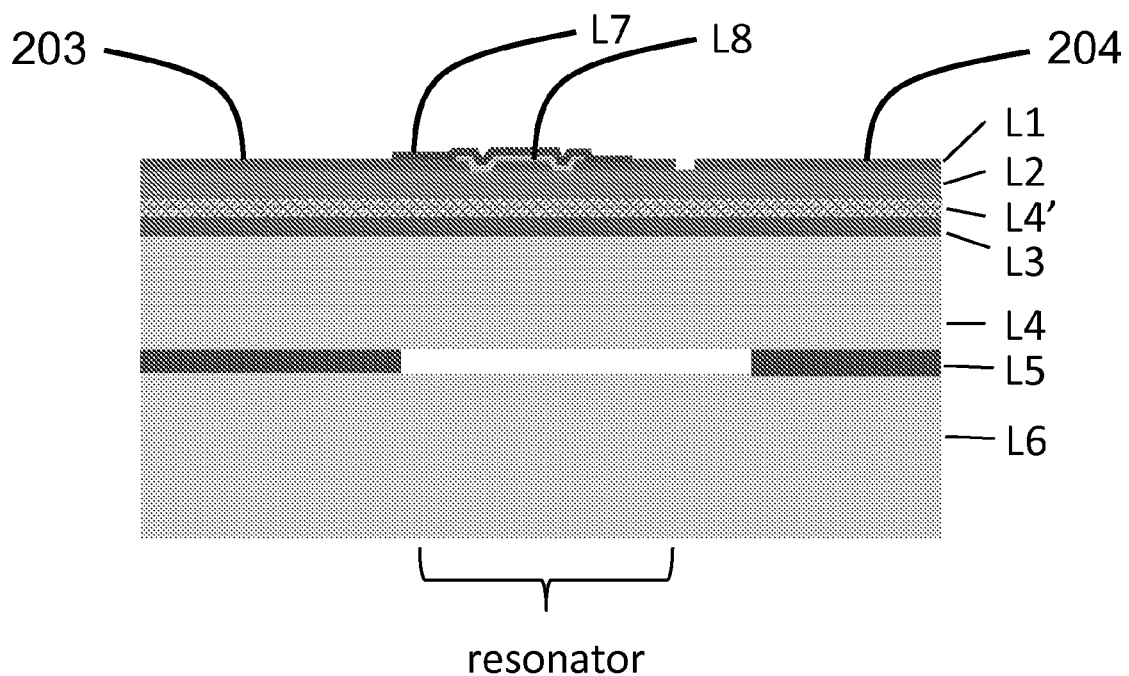

FIGS. 12B and 12C show sectional views of MEMS resonators in accordance with yet further embodiments. In these embodiments, a silicon oxide ($SiO_2$) layer L4' is deposited either on the piezoelectric layer L2, as illustrated in FIG. 12B (i.e., in between layers L1 and L2), or below the piezoelectric layer, as illustrated in FIG. 12C (i.e., in between L2 and the bottom electrode layer L3). As to the other materials layers, a reference is made to the explanation of FIG. 8 and FIG. 10. In certain embodiments, as discussed above with reference to FIG. 8, it is possible that the doped silicon layer L4 acts as the bottom electrode layer, i.e., layers L3 and L4 may be combined into a single silicon layer.

The advantage of these solutions can be understood by considering the following reasoning. To achieve a reduction in the ESR of the resonator it is advantageous to scale down the mass of the resonator by reducing film thicknesses while maintaining the condition that the overall TCF1 of the materials stack be zero. Silicon oxide has a relatively high positive temperature coefficient, higher than that of strongly phosphorus-doped silicon, and it is therefore possible to reduce the resonator materials stack overall thickness (and mass) by replacing a portion of the doped silicon by silicon oxide while keeping the overall TCF1=0. The result of reducing the thickness is that ESR decreases and, in the same time, the capacitance across piezoelectric layer increases. To prevent the capacitance from increasing too much, it is advantageous to place the silicon oxide layer L4' between the bottom and top electrodes as illustrated in FIG. 12B and FIG. 12C.

There are several well know methods to grow silicon oxide layers such as thermal oxidation of silicon, plasma-enhanced chemical vapor deposition (PECVD) or low temperature oxide (LTO) methods. For example, PECVD and LTO methods can be used to grow the $SiO_2$ layers for resonators according to the materials stack of FIGS. 12B and 12C.

In certain embodiments, the bottom electrode layer L3 and the doped silicon layer L4 are combined into a single doped silicon layer L4. In such a case thermal oxide can be conveniently formed from the layer L4 by thermal oxidation thereby forming the layer L4' on top of the remaining layer L4.

Figure 13:
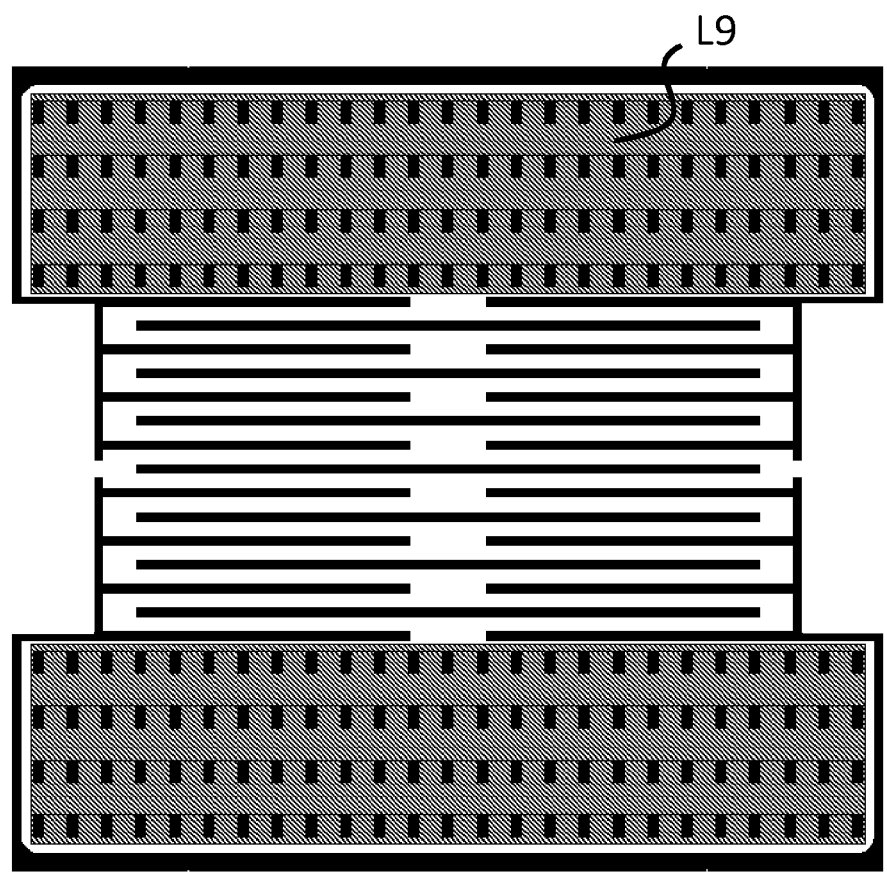
FIG. 13 shows a MEMS resonator with a trimming weight layer in accordance with certain embodiments.

FIG. 13 shows a design similar to that of FIG. 5, but with layer L9: trimming weight layer (diagonally hatched/grey region) on top of masses M1 and M2. The purpose of layer L9 is to provide fine adjustability of the resonance frequency by reducing the thickness of layer L9 (or parts of layer L9), for example, by ion beam trimming or by laser ablation. Material of L9 can be, for example, Mo or Au. As an example, with dimensions similar to that in FIG. 3 and Si device layer thickness of 10 µm, the resonance frequency changes by approximately 40,000 ppm per 100 nm of removed Mo.

Figure 14:
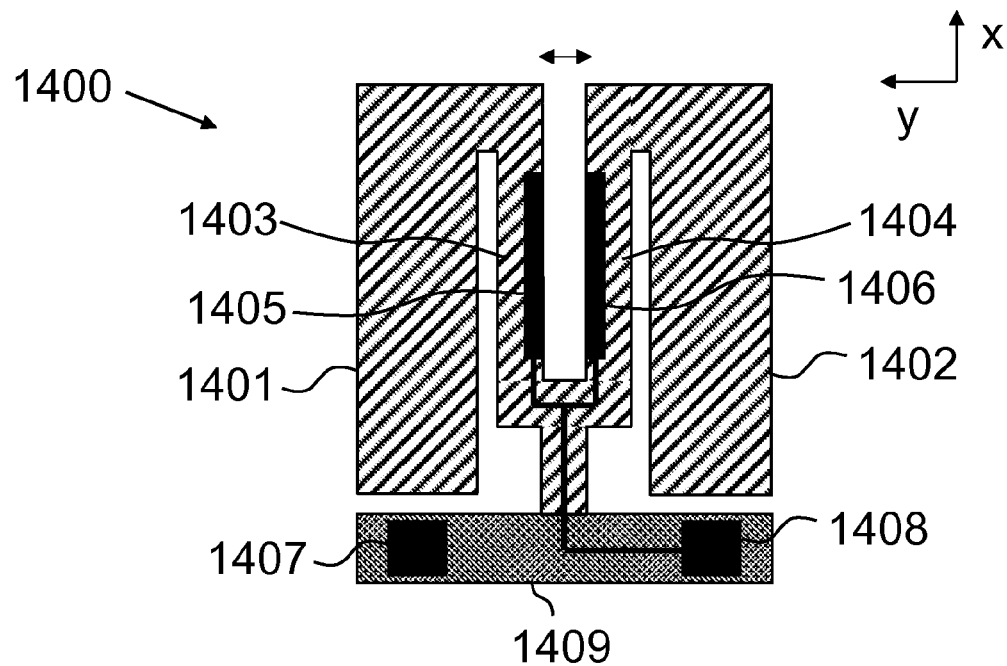
FIG. 14 shows a MEMS resonator of a tuning fork type in accordance with certain embodiments.

FIG. 14 shows a further (singly crystalline) silicon MEMS resonator 1400 in accordance with certain embodiments. As to the materials, general structure and general function of the resonator 1400 a reference is made to embodiments presented in the preceding description. The coordinate system is defined as shown in the figure. Accordingly, the resonator or layers of the resonator structure, such as the piezoelectric layer, generally reside in an xy-plane.

The resonator 1400 can be viewed as a tuning fork resonator equipped with additional masses in the end of vibrating arms to lower the resonance frequency of the spring-mass system to a desired value. Accordingly, in certain embodiments, the resonator 1400 is of a general M shape. The resonator 1400 comprises a spring-mass system having a first weight portion 1401, a second weight portion 1402, and a central spring portion in between the weight portions. In certain embodiments, the central spring portion comprises a first (left) arm 1403 of the tuning fork and a second (right) arm 1404 of the tuning fork. The arms 1403 and 1404 are aligned with x-direction. The left arm 1403 is separated by a gap from the right arm 1404 but also mechanically connected at its end to a respective end of the right arm 1404. The tuning fork is further anchored to a mechanical anchor 1409 at the same end(s) at which the arms were connected. The part 1403 (and part 1404, respectively) is connected to the part 1401 (part 1402, respectively) at the opposite end. Otherwise, there is a first gap in between the parts 1401 and 1403 and a respective second gap in between the parts 1402 and 1404.

The preferred vibration mode is in-plane motion in which the two arms of the resonator 1400 move in antiphase with respect to each other. The vibration arms 1403, 1404 therefore vibrate so that they alternately move closer to each other and move farther from each other in a symmetric manner (as depicted by the double-headed arrow in y-direction).

To minimize the variation of the frequency with temperature, it is advantageous if a single crystalline silicon layer of the resonator is degenerately doped with n-type dopant, such as phosphorus. In certain embodiments, the doping concentration is more than $1*10^{19}$ cm$^{-3}$. In certain embodiments, the doped silicon forms at least 50% of the mass of the vibrating arms 1403, 1404 of the resonator. This is advantageous in striving for high thermal stability. In certain embodiments, the two arms 1403, 1404 are aligned along an <100> crystalline axis such as the [100] crystalline axis of silicon (or deviate less than 5 degrees from that direction), which will also aid in achieving high thermal stability.

In certain embodiments, the resonator 1400 is set into vibration by means of piezoelectric coupling. In certain embodiments, a piezoelectric film (for example, an AlN thin film) is deposited on top of a single crystalline silicon layer of the resonator structure. A top electrode is deposited and patterned on the piezoelectric thin film. In certain embodiments, a first part 1405 of the top electrode is positioned on the vibrating arm 1403 and a second part 1406 is positioned on the vibrating arm 1404. The material of the electrode may be, for example, Mo, Al, Au, Pt, Ag, polycrystalline silicon or another conducting material.

In certain embodiments, the doped silicon layer L4 (see, e.g., FIGS. 8, 10, and 12A-C) acts as the bottom electrode layer. In certain alternative embodiments, there is an additional thin layer or layer stack on the single crystalline silicon which operates as the bottom electrode (see L3 in FIGS. 8, 10, and 12A-C). The materials stack of the resonator 1400 in certain embodiments therefore corresponds to that presented in the preceding with reference to FIG. 8 optionally complemented by the L4' features as disclosed by FIGS. 12A-C.

In certain embodiments, as depicted in FIG. 14 the top electrode is patterned so that when an alternating current signal is connected between the top and bottom electrodes, the two arms of the resonator 1400 experience a force supporting the antiphase resonance. This can be achieved, for example, by patterning the top electrode as depicted in FIG. 14 so that areas of the arms 1403, 1404 on top of the piezoelectric layer that are next to the gap separating the arms 1403, 1404 (i.e., areas 1405 and 1406) are covered by the electrodes parts while the areas of the arms 1403, 1404 that are closer to the weight portions remain uncovered.

In certain alternative embodiments, the top electrode is patterned so that areas of the arms 1403, 1404 on top of the piezoelectric layer that are closer to the weight portions are covered by the electrodes parts while the areas of the arms 1403, 1404 that are next to the gap separating the arms 1403, 1404 remain uncovered.

In certain embodiments, the wiring to the patterned top electrode is arranged from a contact pad 1408 (indicated by the reference numeral 202 for a resonator according to the materials stack of FIG. 8) positioned on the mechanical anchor 1409. A contact pad 1407 (indicated by the reference numeral 201 for a resonator according to the materials stack of FIG. 8) for the bottom electrode may be positioned on the same anchor 1409. (The opening 120 in the piezoelectric layer L2 illustrated in FIG. 8 is not shown in FIG. 14.)

Figure 15:
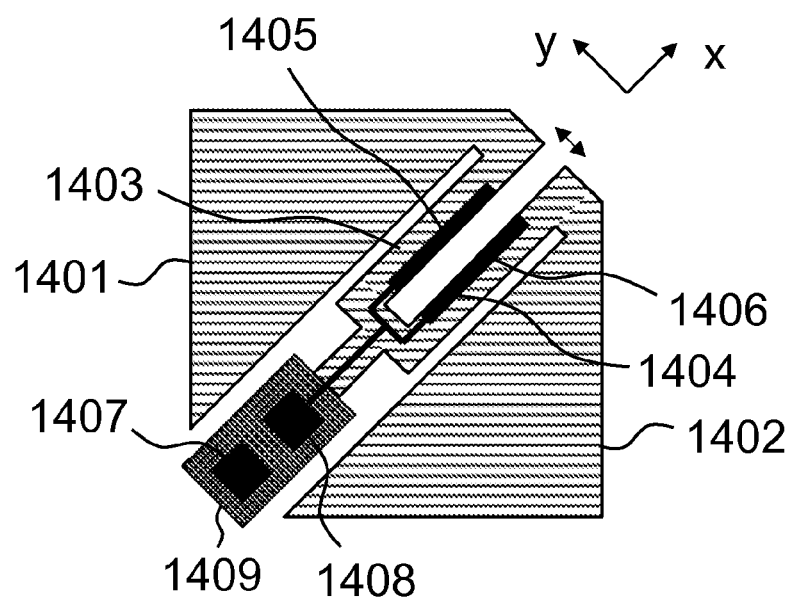
FIG. 15 shows a further MEMS resonator with a diagonal design in accordance with certain embodiments.

FIG. 15 shows another tuning fork resonator in accordance with certain embodiments. The length of the tuning fork arms 1403, 1404 can make use of the diagonal dimension of the chip (or die) concerned whereas the mass elements (weight portions) 1401, 1402 are placed in the corners of the die. The two arms 1403, 1404 in certain embodiments are aligned along an <100> crystalline axis such as the [100] crystalline axis of silicon (or deviate less than 5 degrees from that direction) to minimize the thermal coefficient.

The preferred vibration mode is in-plane motion (in xy-plane) in which the two arms of the resonator move in antiphase with respect to each other. The vibration arms 1403, 1404 (aligned with x-direction) therefore vibrate so that they alternately move closer to each other and move farther from each other in a symmetric manner (as depicted by the double-headed arrow in y-direction in FIG. 15). The materials stack of the resonator shown in FIG. 15 corresponds to that of resonator 1400.

Figure 16A:
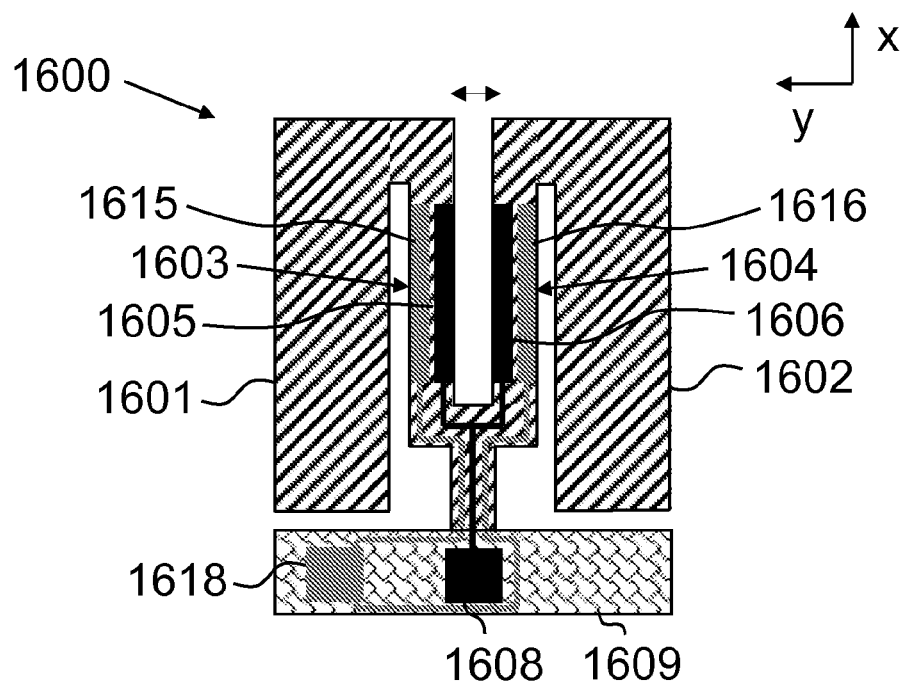
FIGS. 16A-C show further tuning fork resonators in accordance with certain embodiments.

FIG. 16A shows further embodiments of tuning fork resonators. The resonator 1600 shown in FIG. 16A comprises a spring-mass system having a first weight portion 1601, a second weight portion 1602, and a central spring portion in between the weight portions. In certain embodiments, the central spring portion comprises a first (left) arm 1603 of the tuning fork and a second (right) arm 1604 of the tuning fork aligned with x-direction. The left arm 1603 is separated by a gap from the right arm 1604 but also mechanically connected at its end to a respective end of the right arm 1604. The tuning fork is further anchored to a mechanical anchor 1609 at the same end(s) at which the arms were connected. The part 1603 (and part 1604, respectively) is connected to the part 1601 (part 1602, respectively) at the opposite end. Otherwise, there is a first gap in between the parts 1601 and 1603 and a respective second gap in between the parts 1602 and 1604.

The preferred vibration mode is in-plane motion in which the two arms of the resonator 1600 move in y-direction in antiphase with respect to each other. The vibration arms 1603, 1604 therefore vibrate so that they alternately move closer to each other and move farther from each other in a symmetric manner (as depicted by the double-headed arrow).

Accordingly, the resonator 1600 basically corresponds to the resonator 1400. A difference compared to resonator 1400 is in the realization of the actuation method. Instead of a top electrode and a bottom electrode the resonator structure comprises two top electrodes with opposite polarities and an electrically floating bottom electrode layer L3. The materials stack of the resonator 1600 corresponds to any of those presented in the preceding with reference to FIGS. 10 and 12A-C. In certain embodiments, the patterning of the top electrodes is as depicted in FIG. 16A so that a first part 1605 of a first top electrode is positioned on the vibrating arm 1603 and a second part 1606 is positioned on the vibrating arm 1604, and a first part 1615 of a second top electrode is positioned on the vibrating arm 1603 and a second part 1616 is positioned on the vibrating arm 1604. The areas 1605, 1606 of the arms 1603, 1604 that are next to the gap separating the arms 1603, 1604 are covered by the first top electrode and areas 1615, 1616 of the arms 1603, 1604 that are closer to respective weight portions 1601, 1602 are covered by the second top electrode.

In certain embodiments, the wiring to the first top electrode is arranged from a contact pad 1608 positioned on the mechanical anchor 1609. A contact pad 1618 for the second top electrode may be positioned on the same anchor 1609.

Figure 16B:
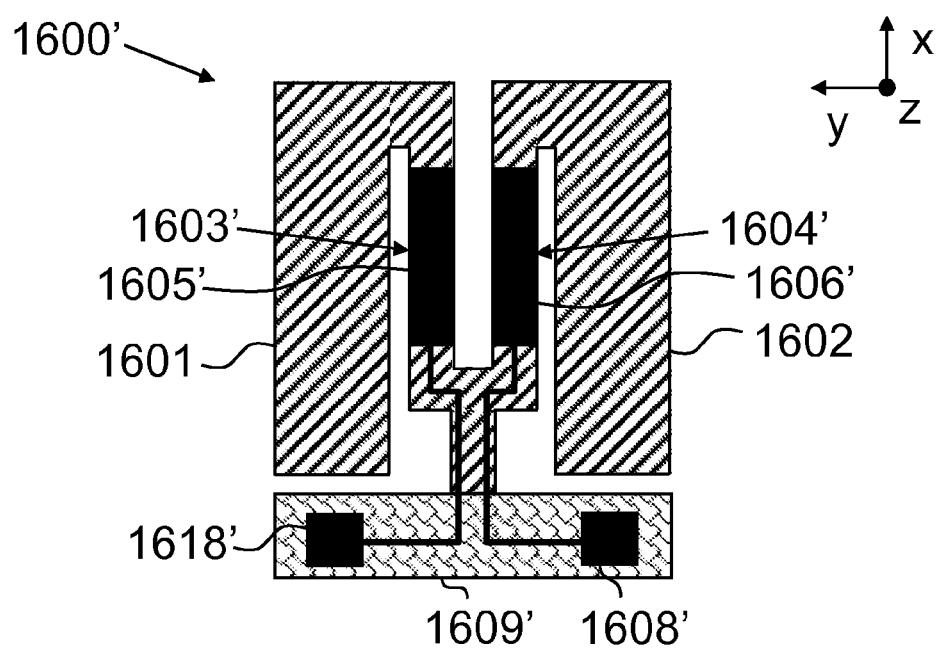

FIG. 16B shows yet other embodiments of tuning fork resonators. The resonator 1600' shown in FIG. 16B comprises a spring-mass system having a first weight portion 1601, a second weight portion 1602, and a central spring portion in between the weight portions. In certain embodiments, the central spring portion comprises a first (left) arm 1603' of the tuning fork and a second (right) arm 1604' of the tuning fork. The left arm 1603' is separated by a gap from the right arm 1604' but also mechanically connected at its end to a respective end of the right arm 1604'. The tuning fork is further anchored to a mechanical anchor 1609' at the same end(s) at which the arms were connected. The part 1603' (and part 1604', respectively) is connected to the part 1601 (part 1602, respectively) at the opposite end. Otherwise, there is a first gap in between the parts 1601 and 1603' and a respective second gap in between the parts 1602 and 1604'.

In this embodiment, the vibration mode is out-of-plane motion in which the two arms of the resonator 1600' move in antiphase with respect to each other. The vibration arms 1603', 1604' therefore vibrate so that when the left arm 1603' moves in the direction of positive z-axis, the right arm 1604' moves in the direction of negative z-axis (and vice versa).

A preferred realization of the electromechanical actuation of such a resonator 1600' is illustrated in FIG. 16B. There are two top electrodes, electrode 1605' for the left arm and electrode 1606' for the right arm, with opposite polarities and an electrically floating bottom electrode layer L3. The electrical signals ($X_{in}$, $X_{out}$) are connected to the contact pads 1618' and 1608' to which the top electrodes 1605' and 1606' are connected, respectively. The contact pads are formed on the mechanical anchor area 1609'. The materials stack of the resonator 1600' may correspond to any of those presented in the preceding with reference to FIGS. 10 and 12A-C.

Figure 16C:
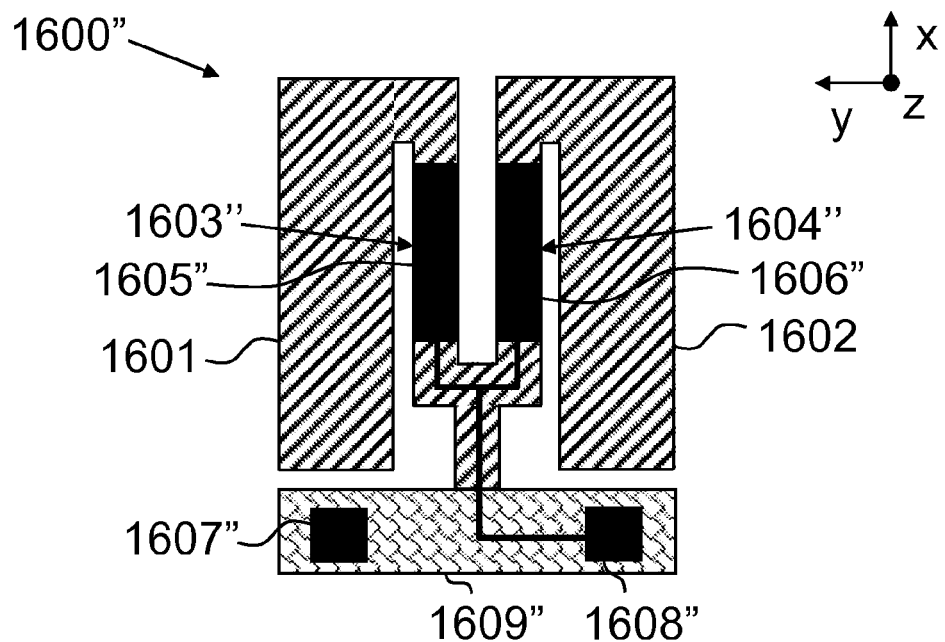

FIG. 16C shows yet other embodiments of tuning fork resonators. Similarly to the resonator 1600', the resonator 1600" shown in FIG. 16C comprises a spring-mass system having a first weight portion 1601, a second weight portion 1602, and a central spring portion in between the weight portions. The central spring portion comprises a first (left) arm 1603" of the tuning fork and a second (right) arm 1604" of the tuning fork. The left arm 1603" is separated by a gap from the right arm 1604" but also mechanically connected at its end to a respective end of the right arm 1604". The tuning fork is further anchored to a mechanical anchor 1609" at the same end(s) at which the arms were connected. The part 1603" (and part 1604", respectively) is connected to the part 1601 (part 1602, respectively) at the opposite end. Otherwise, there is a first gap in between the parts 1601 and 1603" and a respective second gap in between the parts 1602 and 1604".

In certain embodiments, as depicted in FIG. 16C the top electrode is patterned so that when an alternating current signal is connected between the top and bottom electrodes, the two arms of the resonator 1600" experience a force supporting out-of-plane motion in which the two arms of the resonator 1600" move in phase with respect to each other (i.e. the left arm 1603" and the right arm 1604" move both in the direction of positive z-axis or, alternatively, negative z-axis). To support such a vibration mode, the top electrode comprises of two parts, 1605" and 1606", disposed on the left arm and right arms, respectively. The top electrode parts are connected to a contact pad 1608" disposed on the mechanical anchor 1609". A contact pad 1607" for the bottom electrode may be positioned on the same anchor 1609". The materials stack of the resonator 1600" in certain embodiments therefore corresponds to that presented in the preceding with reference to FIG. 8 optionally complemented by the L4' features as disclosed by FIGS. 12A-C.

Figure 17A:
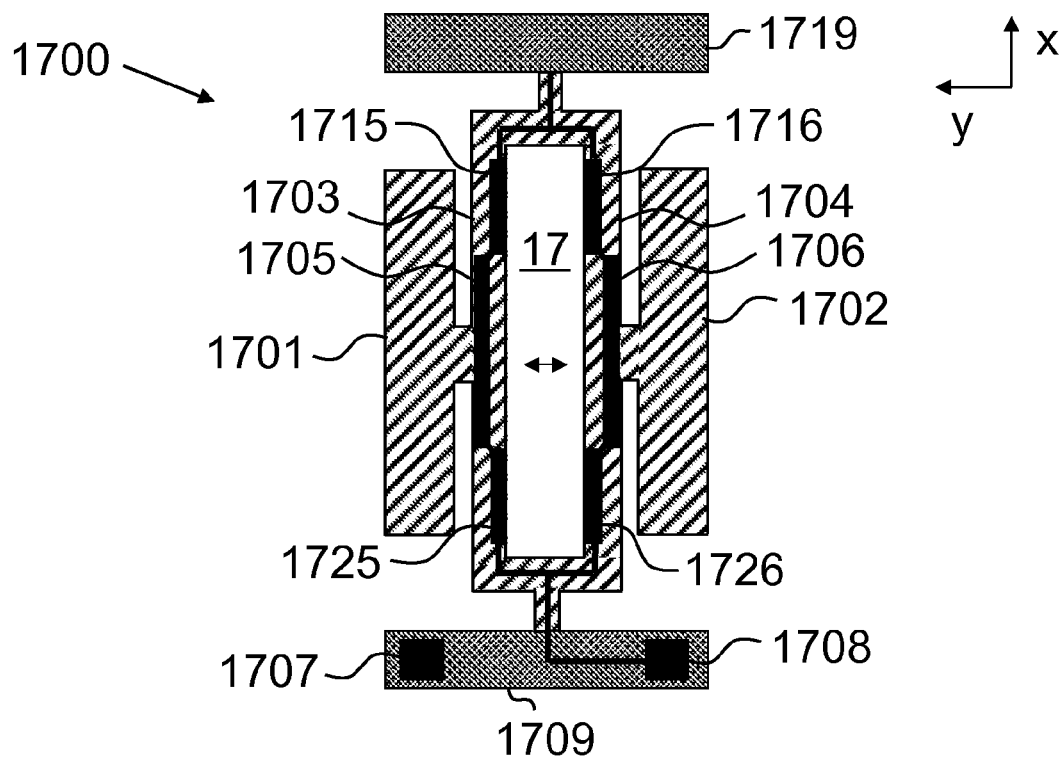
FIGS. 17-21 show MEMS resonators of a double-ended tuning fork type in accordance with certain embodiments.

FIG. 17A shows a further MEMS resonator in accordance with certain embodiments. As to the materials, structure and general function of the resonator 1700 a reference is made to the preceding description, in particular to the resonator 1400.

The resonator 1700 can be viewed as a double-ended tuning fork resonator, since its general structure can be considered as having been formed by connecting two tuning fork resonators at the end of the vibrating arms. The resonator 1700 comprises a spring-mass system having a first weight portion 1701, a second weight portion 1702, and a central spring portion in between the weight portions. In certain embodiments, the central spring portion comprises a first (left) vibrating arm 1703 and a second (right) vibrating arm 1704 aligned with x-direction. The left arm 1703 is separated by a (closed) gap 17 from the right arm 1704 but also mechanically connected at its ends to respective ends of the right arm 1704. The two weight portions are in certain embodiments identical mass elements attached to middle points of the two vibrating arms 1703, 1704 to adjust the value of resonance frequency to a desired value. Otherwise, there are gaps in between the parts 1701 and 1703 and in between the parts 1702 and 1704, respectively. The resonator 1700 is further anchored to a mechanical anchor 1709 at its one end and to another mechanical anchor 1719 at its opposite end.

The preferred vibration mode is in-plane motion in which the two arms of the resonator 1700 move in antiphase in y-direction with respect to each other by piezoelectric transduction. The two (flexural) vibration arms 1703, 1704 therefore vibrate so that they alternately move closer to each other and move farther from each other in a symmetric manner (as depicted by the double-headed arrow). The top electrode is patterned to support such a motion. In certain embodiments, the top electrode is patterned to form an alternating pattern in the longitudinal direction of the arms. In certain embodiments, central longitudinal areas of the arms 1703, 1704 on top of the piezoelectric layer are arranged so that areas next to the weight portions are covered by the top electrode (i.e., top electrode parts 1705 and 1706), and areas closer to the gap 17 remain uncovered. Distal longitudinal areas of the arms 1703, 1704 are arranged conversely, i.e., areas closer to the gap 17 are covered by the top electrode (i.e., top electrode parts 1715, 1725, 1716 and 1726), and areas next to the weight portions remain uncovered.

In certain embodiments, the wiring to the patterned top electrode is arranged from a contact pad 1708 positioned on the mechanical anchor 1709. Further, wiring from top electrode parts to other parts of the top electrode may be arranged. And, wiring from the opposite anchor 1719 may be arranged. A contact pad 1707 for the bottom electrode may be positioned, e.g., at one the anchors 1709, 1719.

Figure 17B:
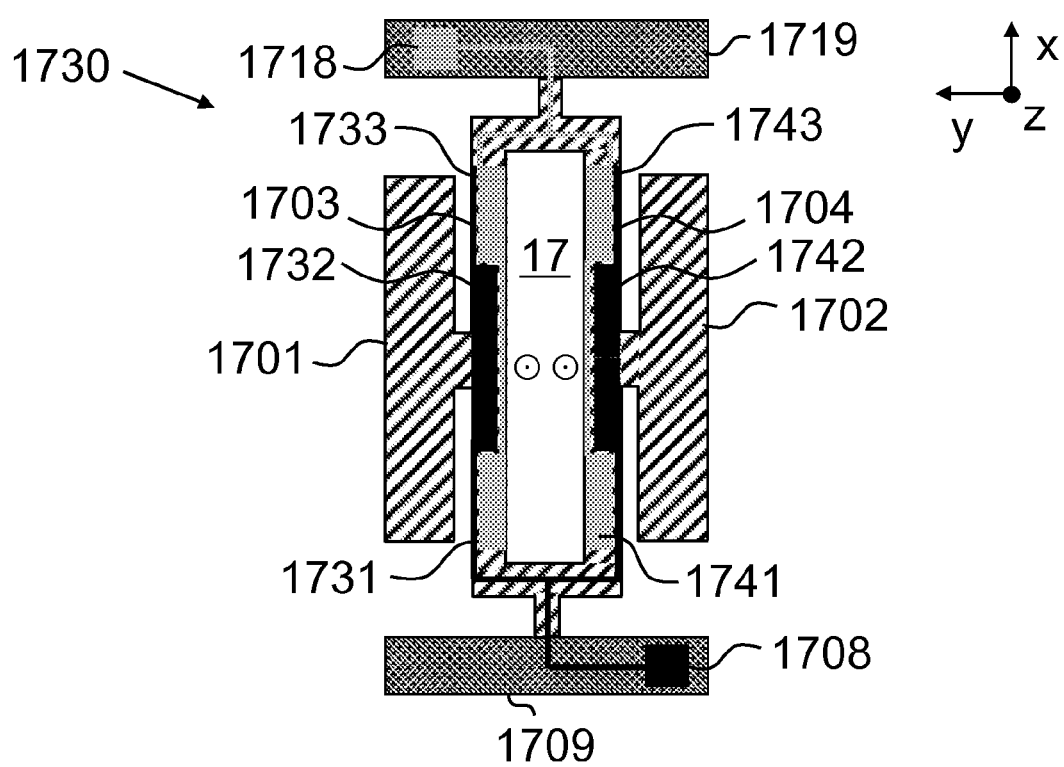

FIG. 17B shows another embodiment of a double-ended tuning fork resonator. The preferred vibration mode of the resonator 1730 is out-of-plane motion in which the two arms of the resonator 1730 move in phase in z-direction with respect to each other by piezoelectric transduction. (The symbols in the gap 17 show the relative direction of motions, whether in the positive z-direction or in the negative z-direction, for the adjacent flexural vibration arms.) The two (flexural) vibration arms 1703, 1704 therefore vibrate so that the both arms 1703 and 1704 move alternately in the positive z-direction or in the negative z-direction. The top electrode is patterned to support such a motion. The resonator structure comprises two top electrodes with opposite polarities and an electrically floating bottom electrode layer L3. The materials stack of the resonator 1730 corresponds to any of those presented in the preceding with reference to FIGS. 10 and 12A-C. In certain embodiments, central longitudinal areas of the arms 1703, 1704 on top of the piezoelectric layer are predominantly covered by a first top electrode structure (i.e., top electrode parts 1732 and 1742) and connected to a (first) contact pad 1708 while the distal longitudinal areas of the arms 1703, 1704 are predominantly covered by a second top electrode structure (i.e., top electrode parts 1731, 1733, 1741 and 1743) and connected to a (second) contact pad 1718. In the example shown in FIG. 17B, the contact pad 1708 is positioned at the anchor 1709 and the contact pad 1718 at the opposite anchor 1719.

Figure 17C:
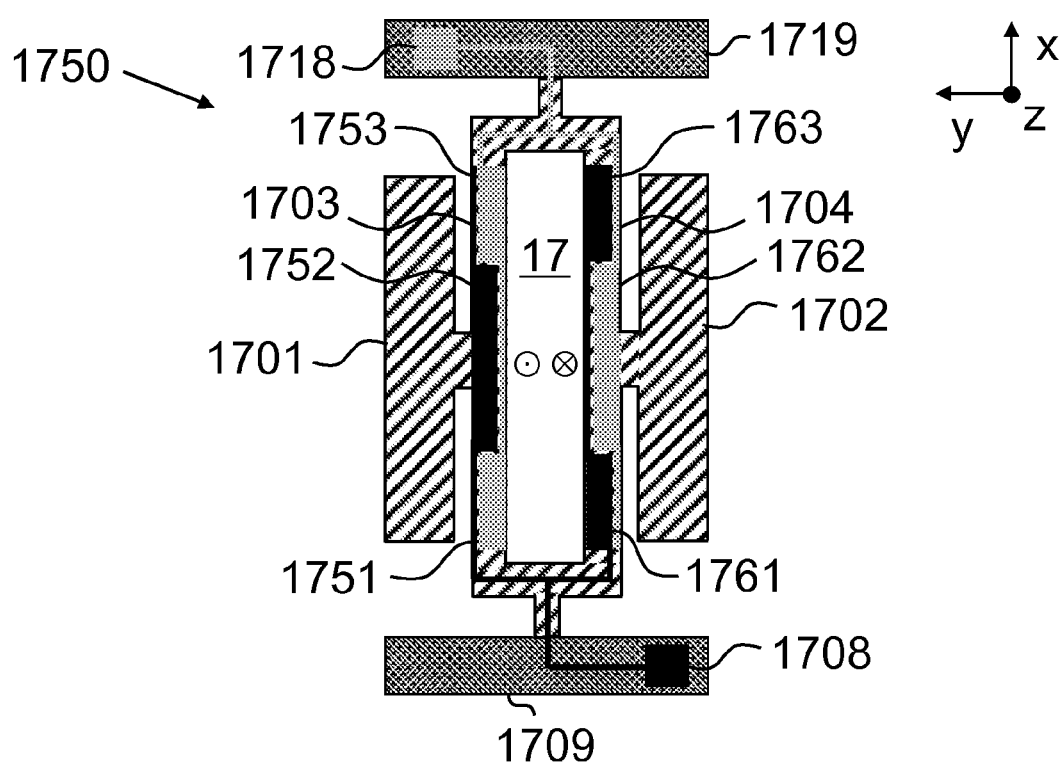

FIG. 17C shows another embodiment of a double-ended tuning fork resonator. The preferred vibration mode of the resonator 1750 is out-of-plane motion in which the two arms of the resonator 1750 move in antiphase in z-direction with respect to each other by piezoelectric transduction. The two (flexural) vibration arms 1703, 1704 therefore vibrate so that the arm 1703 moves in the positive z-direction while the arm 1704 moves in the negative z-direction, or vice versa. The top electrode is patterned to support such a motion. The resonator structure comprises two top electrodes with opposite polarities and an electrically floating bottom electrode layer L3. The materials stack of the resonator 1750 corresponds to any of those presented in the preceding with reference to FIGS. 10 and 12A-C. In certain embodiments, central longitudinal area of the arm 1703 on top of the piezoelectric layer (i.e., top electrode part 1752) and distal longitudinal areas of the arm 1704 on top of the piezoelectric layer (i.e., top electrode parts 1761 and 1763) are predominantly covered by the first top electrode structure and connected to the contact pad 1708 while central longitudinal area of the arm 1704 on top of the piezoelectric layer (i.e., top electrode part 1762) and distal longitudinal areas of the arm 1703 on top of the piezoelectric layer (i.e., top electrode parts 1751 and 1753) are predominantly covered by the second top electrode structure and connected to the contact pad 1718.

In the embodiments illustrated in FIGS. 17B and 17C, the two top electrodes do not need to cross each other. Therefore, the layers L7 and L8 in the materials stacks depicted in FIGS. 10 and 12A-C are not needed.

Similarly as in the preceding tuning fork resonators, the arms of the double ended tuning fork resonators 1703, 1704 in FIGS. 17A-C are aligned with an <100> crystalline axis such as the [100] crystalline axis of silicon (or deviate less than 5 degrees from that direction) to achieve high thermal stability.

Figure 18A:
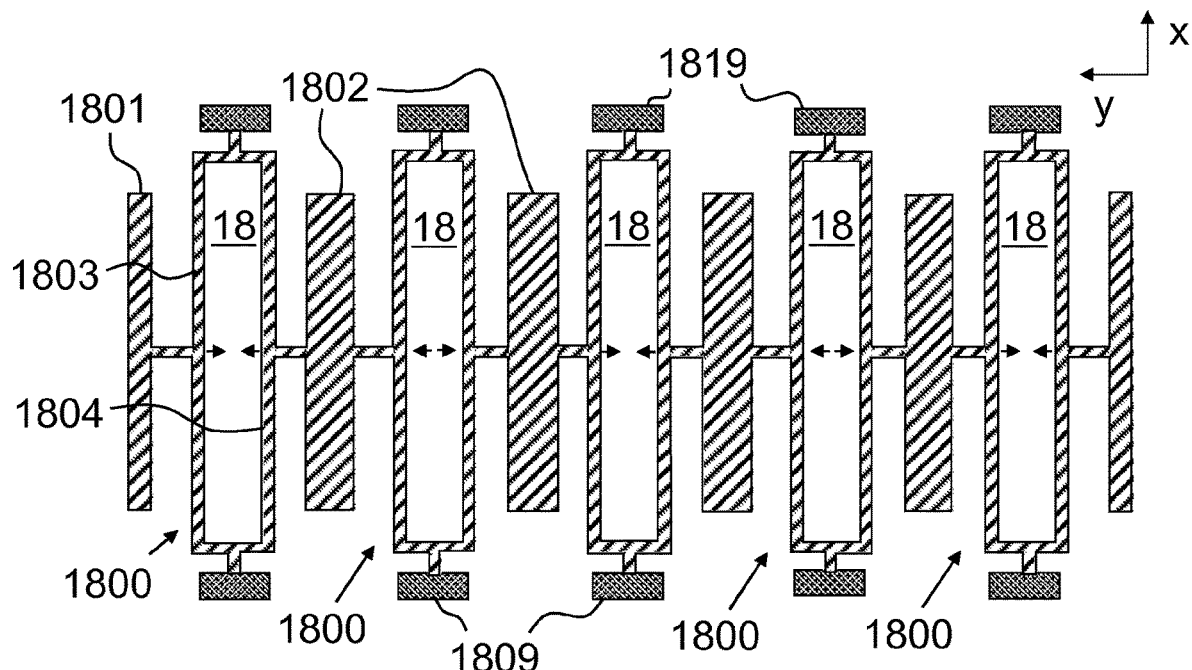
Figure 18B:
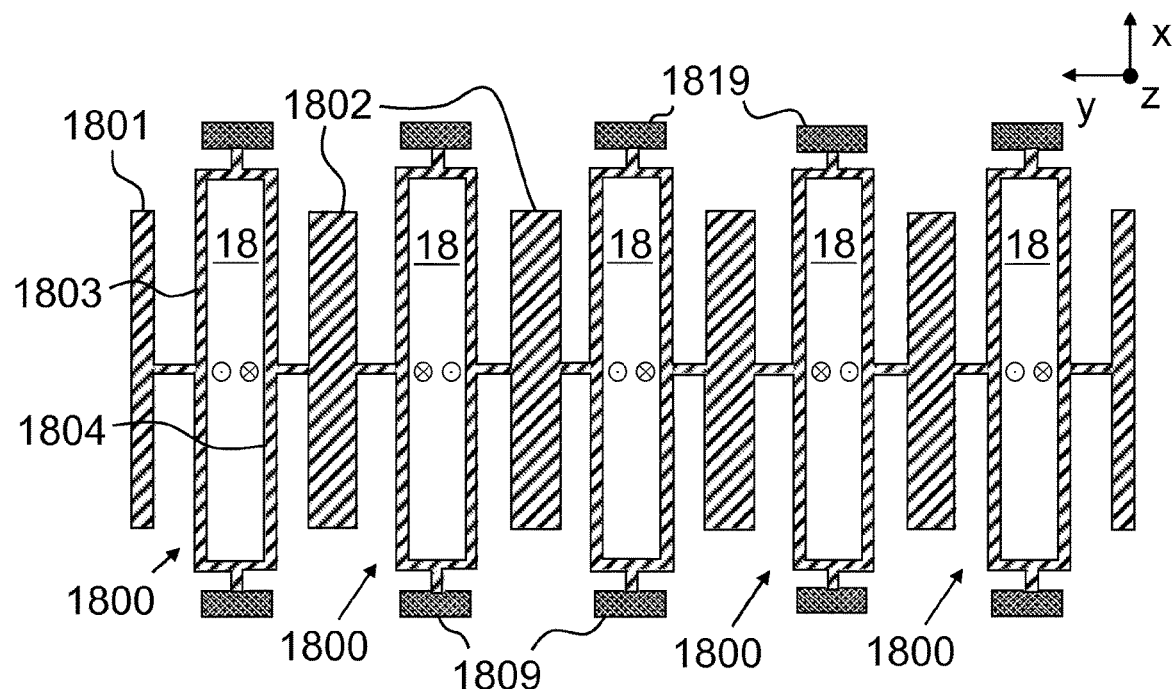

Double ended tuning fork resonators can be combined into larger resonator structures with interconnection elements which force the assembly to resonate in a single collective vibration mode. Examples of such a double ended tuning fork resonator assembly are shown in FIGS. 18A and 18B. Individual double ended tuning fork resonators 1800 (five resonators of the type shown in FIGS. 17A-C) have been placed in a row. The double ended tuning fork resonators 1800 comprise their own vibrating arms 1803, 1804 separated by a gap 18. A shared mass element 1802 is positioned between adjacent central spring portions, and end mass elements 1801 in the ends of the assembly. The assembly comprises mechanical anchors 1809, 1819 connected to respective ends of central spring portions (double ended tuning forks). These anchors may be combined or connected and/or moved closer to a central anchor in other embodiments.

In the example shown in FIG. 18A, the individual double ended tuning fork resonators 1800 all vibrate in the in-plane antiphase mode (in xy-plane) but the vibration modes of adjacent resonators 1800 are shifted by 180 degrees from each other. As a result, the mass elements 1802 (the four innermost mass elements in FIG. 18A) which are connected to their adjacent double ended tuning fork resonator arms 1803, 1804 move in synchrony with the adjacent arms.

Another embodiment of an assembly of connected double ended tuning fork resonators is depicted in FIG. 18B. In this embodiment, the individual double ended tuning fork resonators 1800 all vibrate in the out-of-plane antiphase mode but the vibration modes of resonators 1800 are shifted by 180 degrees from each other (as illustrated by the symbols showing motions in the positive z-direction and the negative z-direction). As a result, the mass elements 1802 (the four innermost mass elements in FIG. 18B) which are connected to their adjacent double ended tuning fork resonator arms 1803, 1804 move in synchrony with the adjacent arms.

In certain embodiments, the volumes (e.g., the widths) of the outermost mass elements 1801 are 50% or substantially 50% of those of the innermost mass elements 1802 to facilitate even distribution of the vibrational energy between the interconnected double ended tuning fork resonators 1800. As in the preceding, the arms 1803, 1804 of the double ended tuning fork resonators 1800 are aligned with an <100> crystalline axis such as the [100] crystalline axis of silicon (or deviate less than 5 degrees from that direction).

Figure 19A:
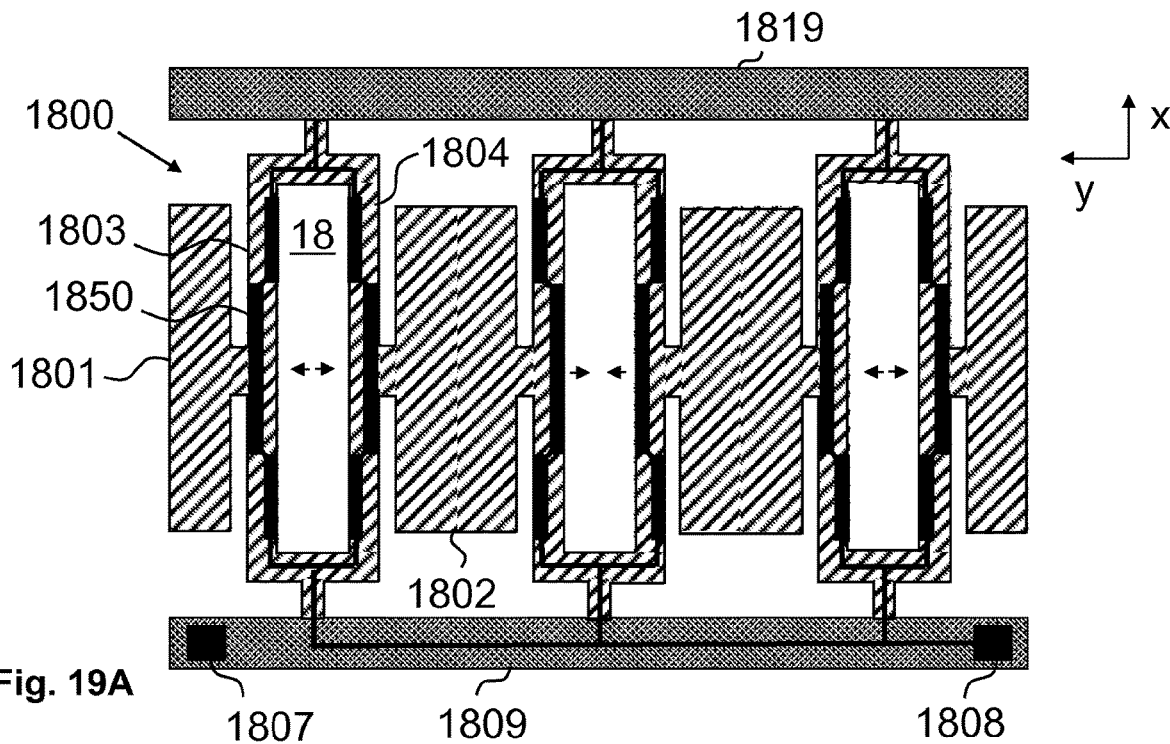
Figure 19B:
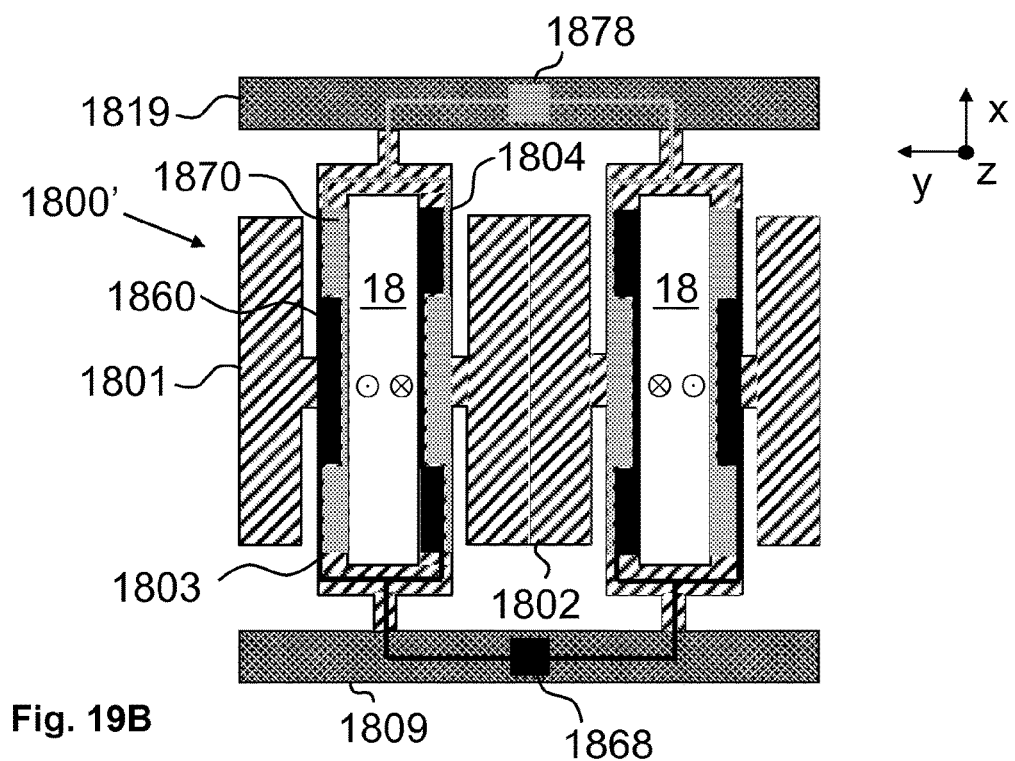

FIGS. 19A and 19B show further embodiments of interconnected double ended tuning fork resonators. In some embodiments, the electrode structure is patterned so that when an alternating current signal is connected between the top and bottom electrodes, the adjacent double ended tuning fork resonators experience forces which support motion with a 180 degrees relative phase shift. In certain embodiments, this is obtained by patterning top electrodes as shown in FIG. 19A. For simplicity, an assembly with (only) three double ended tuning fork resonators 1800 are drawn. When comparing two adjacent resonators 1800, the top electrodes 1850 are patterned on the opposite top-surface sides of the respective flexural arms 1803 (or 1804).

In certain embodiments, the wiring to the patterned top electrodes 1850 is arranged from a contact pad 1808 positioned on a combined mechanical anchor 1809. A contact pad 1807 for the bottom electrode may be positioned on the same anchor 1809.

In yet further embodiments, such as in the example illustrated in FIG. 19B, the structure of corresponding resonators 1800' comprises two top electrodes (1860 and 1870) with opposite polarities and an electrically floating bottom electrode layer L3. The materials stack of the resonator 1800' corresponds to any of those presented in the preceding with reference to FIGS. 10 and 12A-C (except for the layers L7 and L8 in the materials stacks depicted in FIGS. 10 and 12A-C because the layers L7 and L8 are not needed in the example of FIG. 19B). For simplicity, an assembly with (only) two double ended tuning fork resonators 1800' are drawn.

In the double ended tuning fork resonator at left, the central longitudinal area of the arm 1803 on top of the piezoelectric layer is predominantly covered by the first top electrode structure 1860 (connected to a contact pad 1868) and distal longitudinal areas of the arm are predominantly covered by the second top electrode structure 1870 (connected to a contact pad 1878) while for the arm 1804 the central longitudinal area is predominantly covered by the second top electrode structure 1870 and the distal longitudinal areas of the arm are predominantly covered by the first top electrode structure 1860. In the example shown in FIG. 19B, the contact pad 1868 is positioned at the anchor 1809 and the contact pad 1878 at the opposite anchor 1819.

When comparing the two adjacent double ended tuning fork resonators 1800', the respective central and distal longitudinal areas are covered by top electrodes of opposite polarity. When an alternating current signal is connected between the two top electrodes, the adjacent double ended tuning fork resonators experience out-of-plane forces which support motion with a 180 degrees relative phase shift. As a result, the mass elements 1802 (the innermost mass element in FIG. 19B) which are connected to their adjacent double ended tuning fork resonator arms 1803, 1804 move in synchrony with the adjacent arms.

Figure 20:
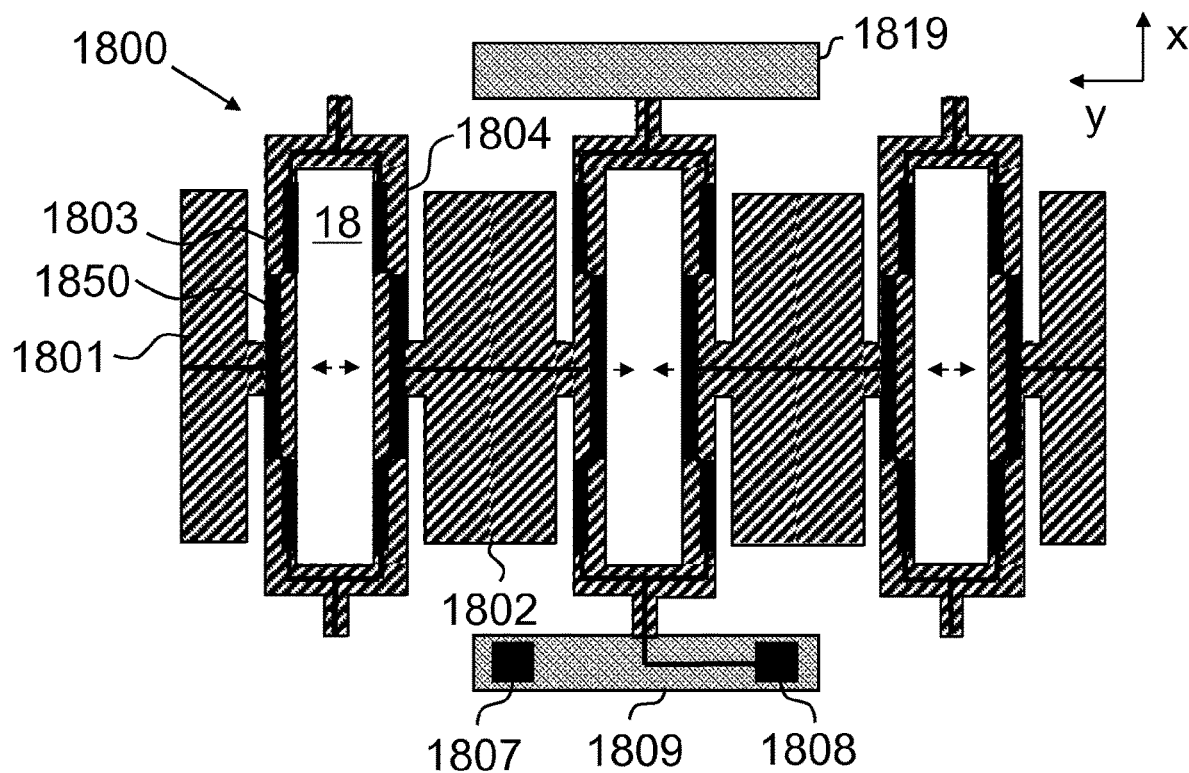

FIG. 20 shows a certain modification to the embodiments shown in FIGS. 18A-B and 19A-B. Only a central double ended tuning fork resonator 1800 (or 1800') is mechanically anchored. The wiring to the top electrodes of the other double ended tuning fork resonators is then implemented by connecting the electrodes of adjacent resonators via the shared mass elements 1802 preferably by a symmetric pattern.

Figure 21:
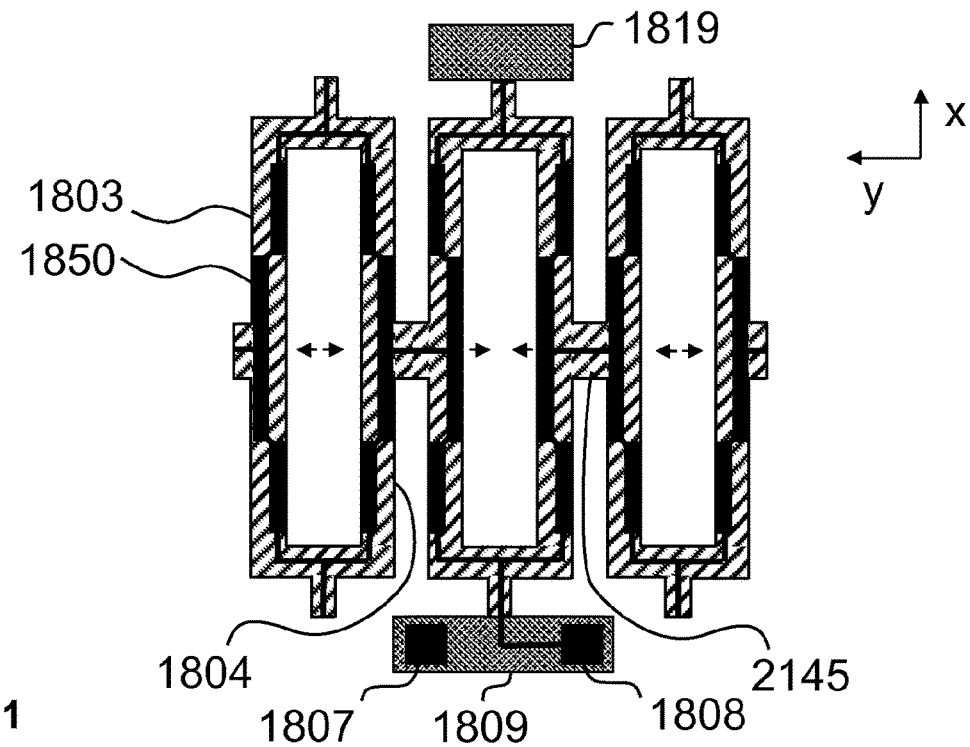

FIG. 21 shows a further modification to the embodiments shown in FIGS. 18-20. The interconnecting mass elements (shared mass elements) have been minimized (or omitted) so that connecting elements between adjacent resonators have simply been implemented by connecting beams 2145.

Figure 22:
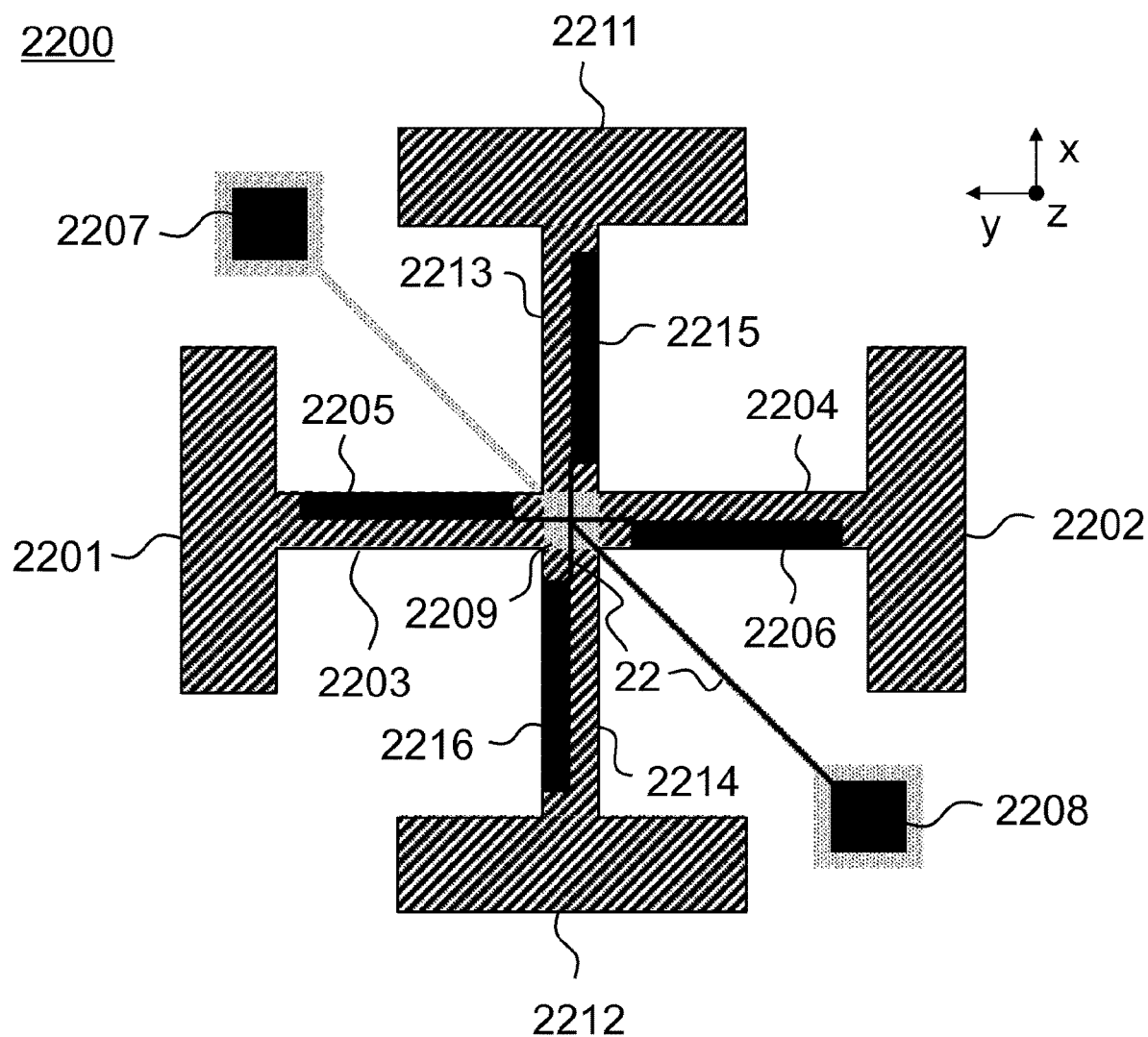
FIG. 22 shows a rotational MEMS resonator in accordance with certain embodiments.

FIG. 22 shows a rotational resonator 2200 in which there is a central spring structure or portion which is mechanically anchored at its center to a mechanical anchor 2209. The central spring portion is connected via four spring elements or arms 2203, 2204, 2213, and 2214 to four mass elements 2201, 2202, 2211, and 2212 arranged in the encircling area. The spring elements form a cross structure and the spring elements are aligned essentially along <100> crystalline axes (or deviate less than 5 degrees from those directions).

Top electrodes 2205, 2206, 2215, and 2216 are patterned so that when an alternating current signal is connected between the top and bottom electrodes, the arms 2203, 2204, 2213, and 2214 experience forces which support rotational (back and forth) motion about the z-axis so that the central anchoring area 2209 remains stationary. This can be done, for example, by patterning the top electrodes as illustrated in FIG. 22 so that surface areas of the arms 2203, 2204, 2213, and 2214 (i.e., areas 2205, 2206, 2215, and 2216) that are on the same side of the arm in question (for example, on the right side as viewed from the anchor 2209) are covered by the electrodes parts while the remaining areas of the arms remain uncovered. In this example, the four mass elements are rotated in the same direction (in phase).

The (preferably metallic) wiring 22 to the top electrodes is arranged from a contact pad 2208. Contact to the bottom electrode is arranged from a contact pad 2207. (The opening 120 in the piezoelectric layer L2 illustrated in FIG. 8 is not shown in FIG. 22.) More generally, the contact pads can represent through-silicon interconnects which are part of a wafer-level packaged resonator.

The materials stack of the resonator 2200 in certain embodiments is implemented similarly as presented in the preceding with reference to FIG. 8 optionally complemented by the L4' features as disclosed by FIGS. 12A-C.

In yet further embodiments, resonators corresponding to the resonator 2200 are implemented with two top electrodes ($X_{in}$ and $X_{out}$) of opposite polarities and with the bottom electrode electrically floating. In such embodiments, there may be an additional insulating layer (L8) between the top electrodes similarly implemented as in embodiments shown in FIG. 10 and FIG. 11 in regions where the two electrodes cross each other. The technical implementation of the materials stack may be implemented similarly as described in any of the embodiments shown in FIGS. 10 and 12A-C.

Without limiting the scope and interpretation of the patent claims, certain technical effects of one or more of the example embodiments disclosed herein are listed in the following. A technical effect is optimized silicon MEMS resonator design. A technical effect is providing an accordion mode MEMS resonator with desired resonance frequency. A further technical effect is good frequency stability over a wide temperature range. A further technical effect is a low equivalent series resistance (ESR). A further technical effect is providing a resonator with a small footprint.

The foregoing description has provided by way of non-limiting examples of particular implementations and embodiments of the present disclosure a full and informative description of the best mode presently contemplated by the inventors for carrying out the disclosed embodiments. It is however clear to a person skilled in the art that the present disclosure is not restricted to details of the embodiments presented above, but that it can be implemented in other embodiments using equivalent means without deviating from the characteristics of the present disclosure.

Furthermore, some of the features of the above-disclosed embodiments of this present disclosure may be used to advantage without the corresponding use of other features. As such, the foregoing description should be considered as merely illustrative of the principles of the present disclosure, and not in limitation thereof. Hence, the scope of the disclosed embodiments is only restricted by the appended patent claims.

The invention claimed is:

1. A microelectromechanical resonator, comprising:
a spring-mass system having
a first weight portion,
a second weight portion, and
a central spring portion in between the first and second weight portions, the microelectromechanical resonator having a layer piezoelectric to actuate the microelectromechanical resonator,
wherein the microelectromechanical resonator further comprises:
a body of silicon doped to an average impurity concentration of at least $2*10^{19}$ $cm^3$,
wherein material portions of the central spring portion are oriented along an x-axis perpendicular to an y-axis in which direction the microelectromechanical resonator is configured to vibrate, and
wherein the x-axis runs along a <100> silicon crystal direction or deviates less than 5 degrees from that direction.

2. The microelectromechanical resonator of claim 1, where the first and second weight portions are symmetric weight portions.

3. The microelectromechanical resonator of claim 1, where the central spring portion is a symmetric portion.

4. The microelectromechanical resonator of claim 1, where the central spring portion comprises a meandering structure attached at a first end to the first weight portion and at an opposite end to the second weight portion.

5. The microelectromechanical resonator of claim 1, where the first weight portion and the second weight portion are connected to the central spring portion at edges of the first weight portion and the second weight portion.

6. The microelectromechanical resonator of claim 1, supporting an accordion mode shape.

7. The microelectromechanical resonator of claim 1, comprising anchoring points in the middle of a first edge and in the middle of an opposite edge of the spring portion in a direction of the microelectromechanical resonator in which the microelectromechanical resonator vibrates.

8. The microelectromechanical resonator of claim 1, comprising anchoring points aligned with a center of mass of the central spring portion or of the spring-mass system.

9. The microelectromechanical resonator of claim 1, comprising an anchoring point to anchor the central spring portion to surroundings, a main resonance mode shape of the microelectromechanical resonator having a nodal point at the anchoring point.

10. The microelectromechanical resonator of claim 1, where the microelectromechanical resonator comprises semiconducting material and/or silicon and/or degenerately doped silicon, and/or more than 50% of a mass of the microelectromechanical resonator consists of degenerately doped silicon, and/or the microelectromechanical resonator comprises a body of silicon doped to an average impurity concentration of at least $10^{20}$ $cm^{-3}$.

11. The microelectromechanical resonator of claim 1, where the microelectromechanical resonator is configured to be actuated piezoelectrically.

12. The microelectromechanical resonator of claim 1, where the central spring portion comprises arms, separated by trenches, aligned with the <100> silicon crystal direction or deviating less than 5 degrees from that direction.

13. The microelectromechanical resonator of claim 1, where the microelectromechanical resonator operates in vacuum.

14. The microelectromechanical resonator of claim 1, where a trench at the end of the first and second weight portions has an air damping effect reducing width.

15. The microelectromechanical resonator of claim 1, where the first and second weight portions comprise a grid of trenches.

16. The microelectromechanical resonator of claim 1, fabricated on a silicon-on-insulator (SOI) wafer.

17. The microelectromechanical resonator of claim 1, configured to operate at a 32 kHz frequency band.

18. The microelectromechanical resonator of claim 1, where the central spring portion is oriented along a diagonal of a rectangular die.

19. The microelectromechanical resonator of claim 1, where the spring-mass system comprises additional support springs attached to the first and second weight portions.

20. The microelectromechanical resonator of claim 1, where a first part of the microelectromechanical resonator resides in a degeneratively doped silicon layer and a second part of the microelectromechanical resonator resides in a $SiO_2$ layer formed beneath or above or on both sides of the degeneratively doped silicon layer.

21. The microelectromechanical resonator of claim 1, comprising the first and second weight portions and the central spring portion arranged in the shape of a tuning fork with side masses.

22. The microelectromechanical resonator of claim 1, comprising a set of double-ended tuning fork microelectromechanical resonators positioned in a row and connected with shared mass elements or connection beams.

23. The microelectromechanical resonator of claim 1, comprising:

a materials stack with a silicon oxide layer in between a top electrode layer and a bottom electrode layer.

24. The microelectromechanical resonator of claim 1, further comprising third and fourth weight portions, wherein the central spring portion is arranged in the form of a cross with a mechanical anchor at its center.

25. The microelectromechanical resonator of claim 1, comprising two top electrodes with opposite polarities and an electrically floating bottom electrode.

26. The microelectromechanical resonator of claim 1, supporting either an in-plane flexural vibration mode of operation or an out-of-plane flexural vibration mode of operation.

27. The microelectromechanical resonator of claim 17, configured to operate at a frequency of 32.768 kHz.

28. A microelectromechanical resonator, comprising:
  a spring-mass system having
  a first weight portion,
  a second weight portion, and
  a central spring portion in between the weight portions, the microelectromechanical resonator having a piezoelectric layer to actuate the microelectromechanical resonator,
  wherein the central spring portion comprises a meandering structure attached at a first end to the first weight portion and at an opposite end to the second weight portion.

29. A microelectromechanical resonator, comprising:
  a spring-mass system having
  a first weight portion,
  a second weight portion, and
  a central spring portion in between the weight portions, the microelectromechanical resonator having a piezoelectric layer to actuate the microelectromechanical resonator,
  wherein the first weight portion and the second weight portion are connected to the central spring portion at edges of the first weight portion and the second weight portion.

30. A microelectromechanical resonator, comprising:
  a spring-mass system having
  a first weight portion,
  a second weight portion,
  a central spring portion in between the weight portions, the microelectromechanical resonator having a piezoelectric layer to actuate the microelectromechanical resonator, and
  anchoring points in the middle of a first edge and in the middle of an opposite edge of the spring portion in a direction of the microelectromechanical resonator in which the microelectromechanical resonator vibrates.

31. A microelectromechanical resonator, comprising:
  a spring-mass system having
  a first weight portion,
  a second weight portion,
  a central spring portion in between the weight portions, the microelectromechanical resonator having a piezoelectric layer to actuate the microelectromechanical resonator, and
  anchoring points aligned with a center of mass of the central spring portion or of the spring-mass system.

32. A microelectromechanical resonator, comprising:
  a spring-mass system having
  a first weight portion,
  a second weight portion,
  a central spring portion in between the weight portions, the microelectromechanical resonator having a piezoelectric layer to actuate the microelectromechanical resonator, and
  anchoring point to anchor the central spring portion to surroundings, a main resonance mode shape of the microelectromechanical resonator having a nodal point at the anchoring point.

* * * * *